(12) United States Patent
Suzuki et al.

(10) Patent No.: US 6,916,555 B2
(45) Date of Patent: Jul. 12, 2005

(54) ORGANIC LUMINESCENCE DEVICE

(75) Inventors: Koichi Suzuki, Yokohama (JP);
Akihiro Senoo, Kawasaki (JP);
Kazunori Ueno, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/385,461

(22) Filed: Mar. 12, 2003

(65) Prior Publication Data

US 2003/0235713 A1 Dec. 25, 2003

Related U.S. Application Data

(63) Continuation of application No. PCT/JP02/08803, filed on Aug. 30, 2002.

(30) Foreign Application Priority Data

Sep. 3, 2001 (JP) ........................................ 2001-265871
Oct. 2, 2001 (JP) ........................................ 2001-306084

(51) Int. Cl.$^7$ ............................. H05B 33/12; C07F 7/10
(52) U.S. Cl. ................... 428/690; 428/917; 313/504; 313/506; 544/229; 544/230; 546/14; 546/15; 556/406
(58) Field of Search ........................... 428/690, 917; 313/504, 506; 252/301.16; 257/40; 544/229, 230, 231; 546/14, 15, 16, 42, 47; 548/406, 408, 418; 556/406, 413

(56) References Cited

U.S. PATENT DOCUMENTS

| | | | |
|---|---|---|---|
| 4,539,507 A | 9/1985 | VanSlyke et al. | 313/504 |
| 4,720,432 A | 1/1988 | VanSlyke et al. | 428/457 |
| 4,885,211 A | 12/1989 | Tang et al. | 428/457 |
| 5,130,603 A | 7/1992 | Tokailin et al. | 313/504 |
| 5,151,629 A | 9/1992 | VanSlyke | 313/504 |
| 5,227,252 A | 7/1993 | Murayama et al. | 428/690 |
| 5,247,190 A | 9/1993 | Friend et al. | 257/40 |
| 5,317,169 A | 5/1994 | Nakano et al. | 257/40 |
| 5,382,477 A | 1/1995 | Saito et al. | 428/690 |
| 5,409,783 A | 4/1995 | Tang et al. | 428/690 |
| 5,514,878 A | 5/1996 | Holmes et al. | 257/40 |
| 5,672,678 A | 9/1997 | Holmes et al. | 528/373 |
| 5,726,457 A | 3/1998 | Nakano et al. | 257/40 |
| 5,763,636 A | 6/1998 | Kreuder et al. | 528/46 |
| 5,840,217 A | 11/1998 | Lupo et al. | 252/583 |
| 5,986,121 A | 11/1999 | Uchida et al. | 556/404 |
| 6,051,319 A | 4/2000 | Uchida et al. | 428/446 |
| 6,093,864 A | 7/2000 | Tokailin et al. | 585/25 |
| 6,329,082 B1 * | 12/2001 | Kreuder et al. | 428/690 |
| 2002/0048686 A1 | 4/2002 | Suzuki et al. | 428/690 |
| 2002/0081454 A1 | 6/2002 | Suzuki et al. | 428/690 |

FOREIGN PATENT DOCUMENTS

| | | |
|---|---|---|
| DE | 196 14 971 | 10/1997 |
| EP | 0 754 691 | 1/1997 |
| EP | 1 120 839 | 8/2001 |
| EP | 1 120 840 | 8/2001 |
| EP | 1 143 538 | 10/2001 |
| JP | 2-247278 | 10/1990 |
| JP | 3-255190 | 11/1991 |
| JP | 4-145192 | 5/1992 |
| JP | 5-202356 | 8/1993 |
| JP | 5-247260 | 9/1993 |
| JP | 7-53951 | 2/1995 |
| JP | 7-278537 | 10/1995 |
| JP | 9-87616 | 3/1997 |
| JP | 9-202878 | 8/1997 |
| JP | 9-227576 | 9/1997 |
| WO | 97/39045 | 10/1997 |

OTHER PUBLICATIONS

Ruilian Wu, et al., "Convergent Synthetic Routes to Orthogonally Fused Conjugated Oligomers Directed toward Molecular Scale Electronic Device Applications", J. Org. Chem., vol. 61, pp. 6906–6921 (1996), no month.

Yuxia Liu, et al., "Structure and Chemistry of 1–Silafluorenyl Dianion, Its Derivatives, and an Organosilicon Diradical Dianion", J. Am. Chem. So c., vol. 124, No. 1, pp. 49–57 (2002), published on Web Dec. 06, 2001.

J. H. Burroughes, et al., "Light–Emitting Diodes Based on Conjugated Polymers", Letters to Nature, vol. 347, pp. 539–541 (Oct. 11, 1990).

Ari Aviram, "Molecules for Memory, Logic and Amplification", J. Am. Chem. Soc., vol. 110, pp. 5687–5692 (1988), no month.

C.W. Tang, et al., "Organic Electroluminescent Diodes", Appl. Phys. Lett., vol. 51, pp. 913–915 (Sep. 21, 1987).

* cited by examiner

Primary Examiner—Marie Yamnitzky
(74) Attorney, Agent, or Firm—Fitzpatrick, Cella, Harper & Scinto

(57) ABSTRACT

In an organic luminescence device formed of one or plural layers of organic films between an anode and a cathode, at least one layer is any one of a luminescence layer, an electron injection layer and an electron-transporting layer and is formed of at least a spiro compound of formula (I-a) or (I-b) having a carbon atom or a silicon atom as a spiro atom and having four ring structures including at least one nitrogen atom-containing ring structure. By the use of the spiro compound of the formula (I-a) or (I-b), the resultant organic luminescence device produces a high-luminance fluorescent luminescence at a low voltage for a long period of time.

3 Claims, 2 Drawing Sheets

ORGANIC LUMINESCENCE DEVICE

This is a continuation of PCT/JP 02/08803, filed Aug. 30, 2002.

TECHNICAL FIELD

The present invention relates to an organic (electro-) luminescence device and particularly to an organic luminescence device for emitting light by applying an electric field to a film of an organic compound (organic compound layer).

BACKGROUND ART

An organic luminescence device generally comprises a pair of electrodes (comprising an anode and a cathode) and a film comprising a fluorescent organic compound disposed between the electrodes. Into the organic compound layer (film), holes and electrons are injected from the anode and the cathode, respectively, thus forming excitons of the fluorescent organic compound. When the excitons are returned to ground state, the organic luminescence device emits light or causes luminescence.

According to a study by Eastman Kodak Co. ("Appl. Phys. Lett.", vol. 51, pp. 913- (1987)), it has been reported that a function-separation type organic luminescence layer comprising mutually laminated two layers including a layer of an aluminum quinolinol complex (as an electron transporting and luminescent material) and a layer of a triphenylamine derivative (as a hole transporting material) causes luminescence at a luminance (brightness) of ca. 1,000 cd/m$^2$ under application of a voltage of ca. 10 volts. This is also reported in, e.g., U.S. Pat. Nos. 4,539,507; 4,720,432 and 4,885,211.

Further, by changing species of the fluorescent organic compound, it is possible to effect luminescence over broad wavelength regions ranging from an ultraviolet region to an infrared region. In this regard, various compounds have been extensively studied in recent years. Such compounds have been proposed in, e.g., U.S. Pat. Nos. 5,151,629, 5,409,783 and 5,382,477, and Japanese Laid-Open Patent Applications (JP-A) 2-247278 (corr. to U.S. Pat. Nos. 5,130,603 and 6,093,864), JP-A 3-255190 (corr. to U.S. Pat. No. 5,227, 252), JP-A 5-202356, JP-A 9-202878 and JP-A 9-227576.

In addition to the above-mentioned organic luminescence devices using low-molecular weight materials, an organic luminescence device using a conjugated polymer has been reported by a research group of Cambridge University ("Nature", vol. 347, pp. 539- (1990)). According to this report, a signal layer of polyphenylenevinylene (PPV) is formed through a wet-coating process and luminescence from the single layer is confirmed. Such an organic luminescence device using a conjugated polymer has also been proposed by, e.g., U.S. Pat. Nos. 5,247,190, 5,514,878 and 5,672,678, JP-A 4-145192 (corr. to U.S. Pat. Nos. 5,317,169 and 5,726,457), and JP-A 5-247460.

As described above, recent progress in organic luminescence device is noticeable, and the resultant organic luminescence devices are characterized by high luminance (brightness) under application of a low voltage, various (light-)emission wavelengths, high-speed responsiveness, small thickness and light weight, thus suggesting possibility of wide applications.

However, the above-described organic luminescence devices are still required to effect light output (emission) at a higher luminance and/or a higher conversion efficiency in the present state. These organic luminescence devices are also still insufficient in terms of durability such that the devices are liable to be changed in their properties with time when used for a long period or liable to be deteriorated by the influence of ambient air containing oxygen or of humidity. Further, in the case of using the organic luminescence devices for full-color display, it is necessary to effect luminescences of blue, green and red with good color purities. However, a satisfactory solution to the problem has not been realized yet, and particularly a red luminescence with a good color purity has not been satisfactorily provided.

On the other hand, spiro compounds having a unique three-dimensional structure and unique material properties have been noted as an organic functional material (J. Am. Chem. Soc. 110, p. 5687- (1988)). A proposal of using a spiro compound in an organic luminescence device has been reported (JP-A 7-278537) but has failed to provide an electron-transporting layer or a luminescence layer exhibiting sufficient luminescence performance.

DISCLOSURE OR INVENTION

A generic object of the present invention is to provide improvements to problems an mentioned above encountered in organic luminescence devices proposed heretofore.

A more specific object of the present invention is to provide an organic (electro-) luminescence device capable of effecting light output (emission) at high efficiency and luminance while realizing a prolonged life.

Another object of the present invention is to provide an organic luminescence device capable of providing a wide variety of emission wavelengths and emission hues, inclusive of particularly orange and red hues, and a good durability.

A further object of the present invention is to provide an organic luminescence device which can be produced easily and relatively inexpensively.

According to the present invention, there is provided an organic luminescence device, comprising:

a pair of an anode and a cathode, and at least one organic layer disposed between the anode and the cathode, wherein the above-mentioned at least one organic layer comprises a layer comprising at least one species of a compound represented by the following formula (I-a):

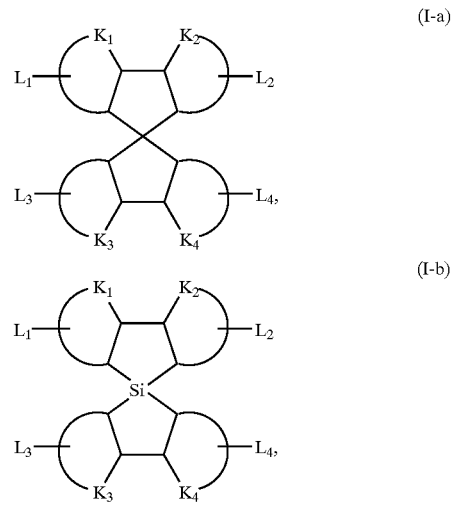

wherein $K_1$, $K_2$, $K_3$ and $K_4$ independently denote a substituted or unsubstituted aromatic ring or a substituted or unsubstituted heterocyclic ring, at least one of $K_1$, $K_2$, $K_3$ and $K_4$ being a heterocyclic ring containing at least one nitrogen atom; and $L_1$, $L_2$, $L_3$ and $L_4$ independently denote a hydrogen atom, an alkyl group, a substituted or unsubstituted aralkyl group, a substituted or unsubstituted aryl group, a substituted or unsubstituted heterocyclic group, an alkoxy group, a nitro group, a substituted or unsubstituted amino group, or a group represented by any one of the following formulas (X), (XI) and (XII):

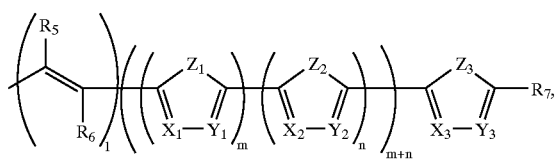

(X)

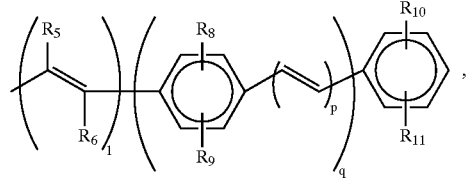

(XI)

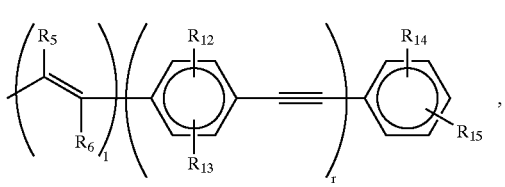

(XII)

wherein $R_5$ to $R_{15}$ independently denote a hydrogen atom, an alkyl group, a substituted or unsubstituted aralkyl group, a substituted or unsubstituted aryl group, a substituted or unsubstituted heterocyclic group, or a nitro group;

$X_1$ to $X_3$ and $Y_1$ to $Y_3$ independently denote a nitrogen atom or C—$R_{16}$ where $R_{16}$ denotes a hydrogen atom, an alkyl group, a substituted or unsubstituted aralkyl group, or a substituted or unsubstituted aryl group;

$Z_1$ to $Z_3$ independently denote —O—, —S—, —NR$_{17}$—, —Si($R_{18}$)$R_{19}$—, —C($R_{20}$)$R_{21}$—, —CH═CH— or —CH═N—, in which $R_{17}$, $R_{20}$ and $R_{21}$ independently denote a hydrogen atom, an alkyl group, a substituted or unsubstituted aralkyl group, a substituted or unsubstituted aryl group, or a substituted or unsubstituted heterocyclic group; and $R_{18}$ and $R_{19}$ independently denote an alkyl group, a substituted or unsubstituted aralkyl group, a substituted or unsubstituted aryl group, or a substituted or unsubstituted heterocyclic group;

l and p are respectively 0 or 1;

m and n are respectively 0 or an integer of 1–30, with the proviso that m+n is an integer of 1–30; and q and r are respectively an integer of 2–30.

BEST MODE FOR PRACTICING THE INVENTION

Figure 1:
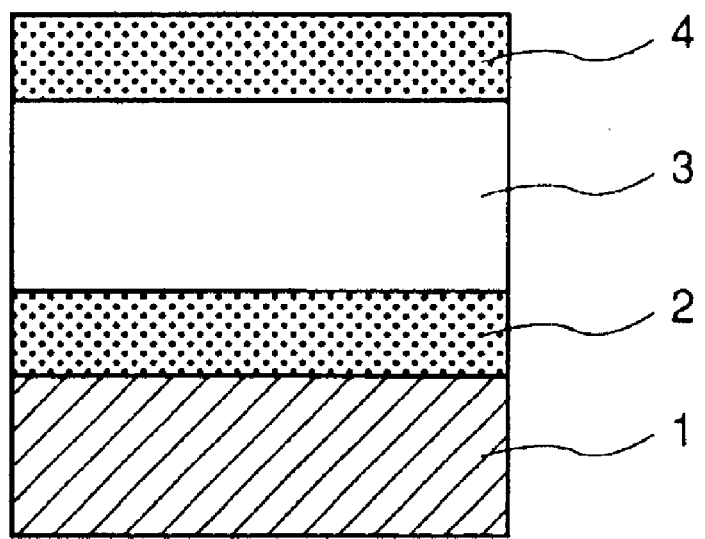
FIGS. 1 to 4 are schematic sectional views each illustrating a basic structure of an organic luminescence device according to an embodiment of the present invention.

The organic luminescence device according to the present invention is characterized in that at least one organic (compound) layer disposed between the pair of electrodes (anode and cathode) includes a layer comprising at least one species of a spiro compound represented by the above-mentioned formula (I-a) or (I-b).

In the case of using the spiro compound of the formula (I-a) having a carbon atom as a spiro atom, the spiro compound may preferably be a compound represented by any one of the following formulas (II-a) to (IX-a):

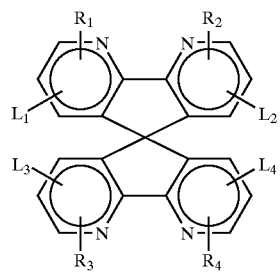

(II-a)

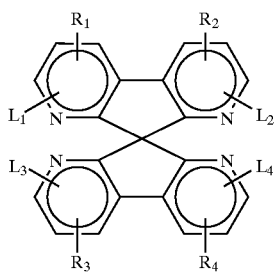

(III-a)

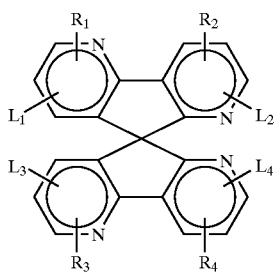

(IV-a)

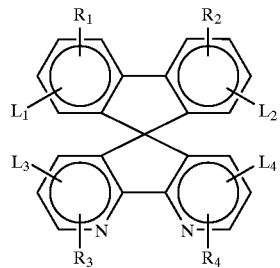

(V-a)

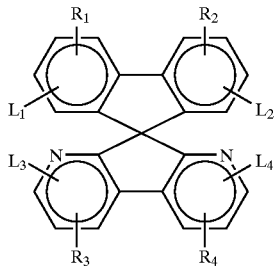

(VI-a)

(VII-a)

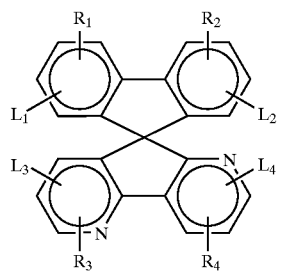

(VIII-a)

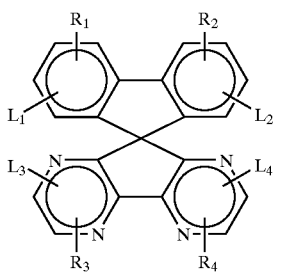

(IX-a)

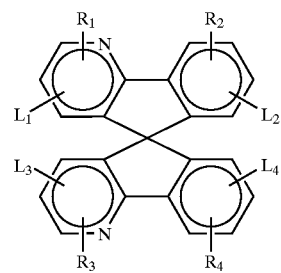

wherein $R_1$ to $R_4$ independently denote a hydrogen atom, an alkyl group, a substituted or unsubstituted aralkyl group, a substituted or unsubstituted aryl group, a substituted or unsubstituted heterocyclic group, an alkoxy group, a nitro group, or a substituted or unsubstituted amino group.

In the case of using the spiro compound of the formula (I-b) having a silicon atom as a spiro atom, the spiro compound may preferably be a compound represented by any one of the following formulas (II-b) to (IX-b):

(II-b)

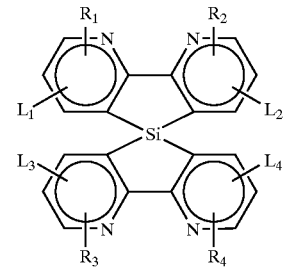

(III-b)

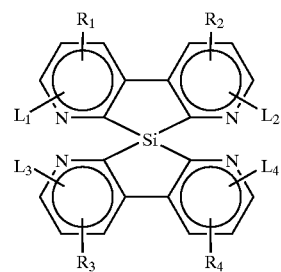

(VI-b)

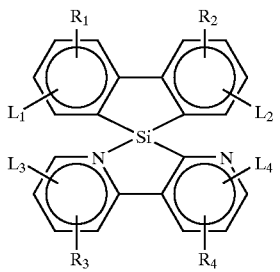

(VII-b)

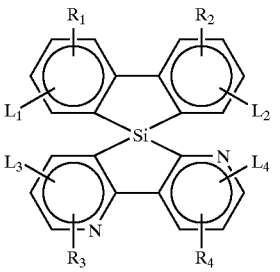

(IV-b)

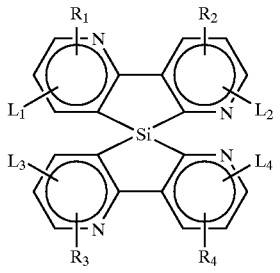

(V-b)

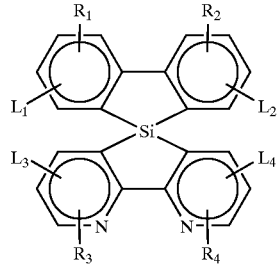

(VIII-b)

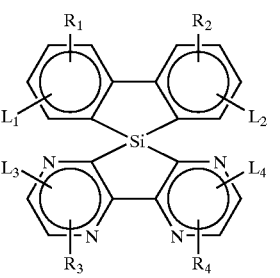

(IX-b)

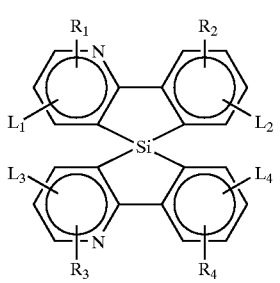

wherein $R_1$ to $R_4$ independently denote a hydrogen atom, an alkyl group, a substituted or unsubstituted aralkyl group, a substituted or unsubstituted aryl group, a substituted or unsubstituted heterocyclic group, an alkoxy group, a nitro group, or a substituted or unsubstituted amino group.

In the organic luminescence device of the present invention at least one of $L_1$ to $L_4$ in the formula (I-a) or (I-b) may preferably be the above-mentioned group represented by any one of the formulas (X), (XI) and (XII) since the resultant spiro compound has a high glass transition point to improve a stability of the organic luminescence device and the resultant emission wavelength is shifted to a longer wavelength side. Further, in the organic luminescence device of the present invention, the layer comprising at least one species of the spiro-compound of the formula (I-a) or (I-b) may preferably be used as electron injection layer, an electron-transporting or a luminescence layer.

Specific examples of the groups represented by $K_1$ to $K_4$, $L_1$ to $L_4$ and $R_1$ to $R_{21}$ in the above-mentioned formula (I-a) to (IX-a), (I-b) to (IX-b) and (X) to (XII) are enumerated hereinbelow.

Specific examples of the alkyl group may include: methyl, ethyl, n-propyl, iso-propyl, n-butyl, tert-butyl, and octyl.

Specific examples of the aralkyl group may include: benzyl and phenethyl.

Specific examples of the aryl group may include: phenyl, biphenyl, terphenyl, naphthyl, anthryl, phenanthryl, and fluorenyl.

Specific examples of heterocyclic group may include: thienyl, pyrrolyl, imidazolyl, furyl, pyridyl, indolyl, quinolinyl, and carbazolyl.

Specific examples of the alkoxyl group may include: methoxyl, ethoxyl, propoxyl, and phenoxyl.

Specific examples of the amino group may include: dimethylamino, diethylamino, dibenzylamino, and diphenylamino.

Specific examples of the substituents which may be possessed by the above-mentioned groups may include: alkyl groups, such as methyl, ethyl and propyl; aralkyl groups, such as benzyl and phenethyl; aryl groups, such as phenyl, nephthyl and anthryl; heterocyclic groups, such as thienyl, pyrrolyl, pyridyl and quinolinyl; and amino groups, such as dimethylamino, diethylamino, dibenzylamino and diphenylamino.

Further, specific examples of the preferred groups represented by the above-mentioned formulas (X), (XI) and (XII) as the groups $L_1$ to $L_4$ in the formula (I-a) or (I-b) may include those (A-1 to A-15) shown below.

A-1
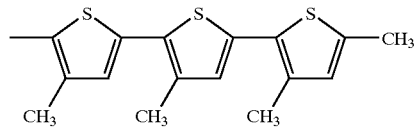

A-2
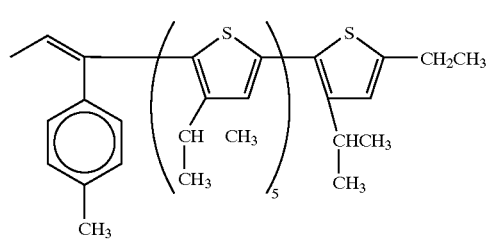

A-3
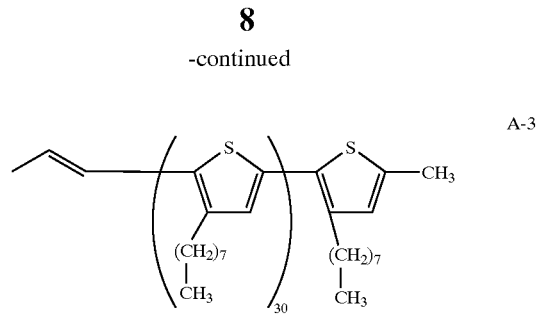

A-4
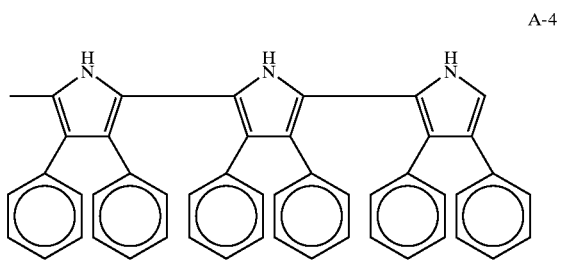

A-5
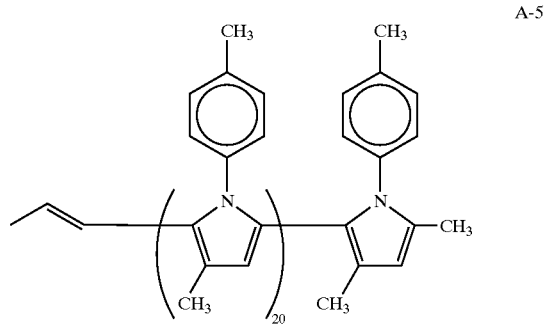

A-6
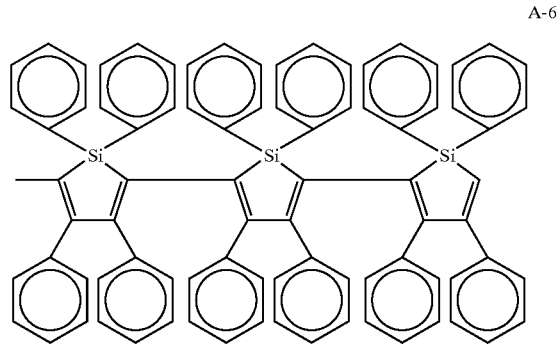

A-7
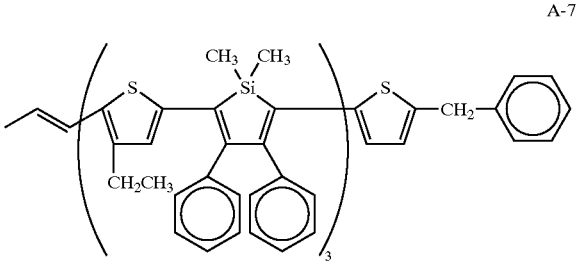

A-8
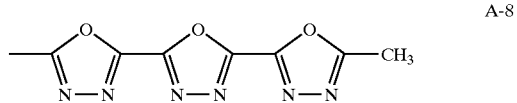

-continued
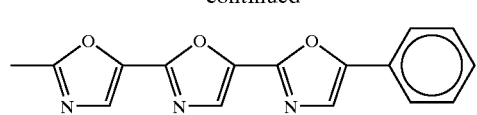 A-9
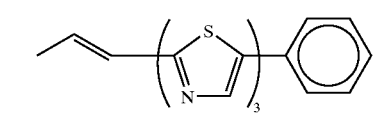 A-10
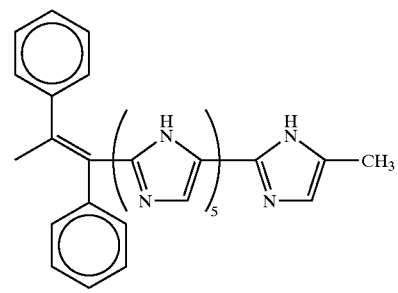 A-11
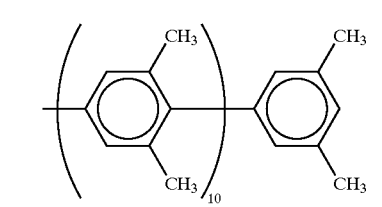 A-12
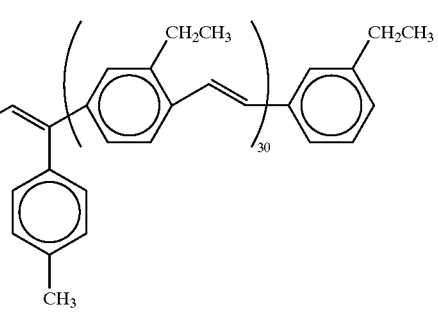 A-13
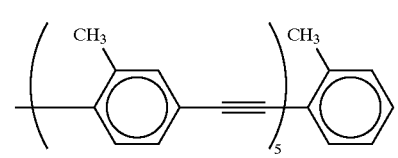 A-14
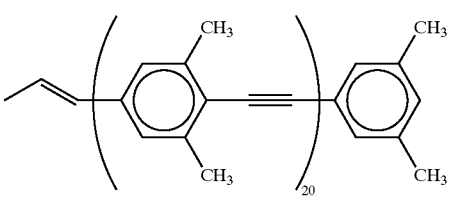 A-15
Other specific examples of the groups $L_1$ to $L_4$ may include those (B-1 to B-16) shown below.
 B-1
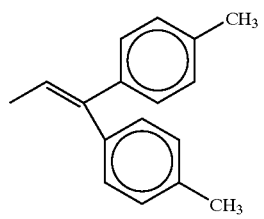 B-2
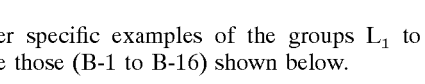 B-3
 B-4
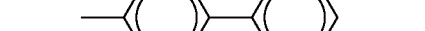 B-5
 B-6
 B-7
 B-8
 B-9
 B-10

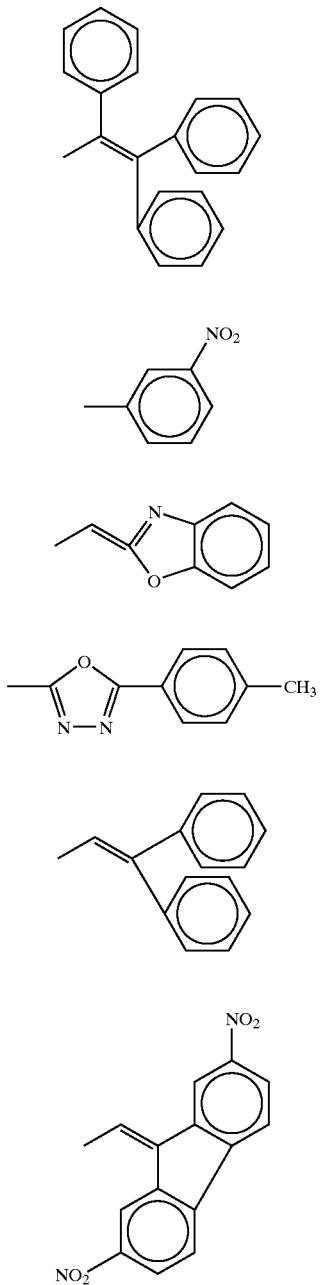

synthesized by, e.g., methods as reported by James M, Tour et al; Journal of Organic Chemistry, Vol. 61, pp. 6906-(1996) and R. West et al.; J. Am. Chem. Soc., 124, pp. 49-(2002).

EXAMPLE COMPOUNDS

TABLE 1

Formula (II-a)

| No. | $R_1$ | $R_2$ | $R_3$ | $R_4$ | $L_1$ | $L_2$ | $L_3$ | $L_4$ |
|---|---|---|---|---|---|---|---|---|
| a-1 | H | H | H | H | A-1 | A-1 | A-1 | A-1 |
| a-2 | H | H | H | H | A-5 | A-5 | A-5 | A-5 |
| a-3 | H | H | H | H | A-11 | A-11 | A-11 | A-11 |
| a-4 | H | H | H | H | A-14 | A-14 | A-14 | A-14 |
| a-5 | $CH_3$ (3) | $CH_3$ (6) | H | H | H | H | B-1 | B-1 |
| a-6 | H | H | H | H | B-2 | B-2 | B-2 | B-2 |
| a-7 | H | H | H | H | B-3 | B-3 | B-3 | B-3 |

TABLE 2

Formula (III-a)

| No. | $R_1$ | $R_2$ | $R_3$ | $R_4$ | $L_1$ | $L_2$ | $L_3$ | $L_4$ |
|---|---|---|---|---|---|---|---|---|
| a-8 | H | H | H | H | A-4 | A-4 | A-4 | A-4 |
| a-9 | H | H | H | H | A-7 | A-7 | A-7 | A-7 |
| a-10 | H | H | H | H | A-12 | A-12 | A-12 | A-12 |
| a-11 | H | H | H | H | $CH_2CH_3$ | $CH_2CH_3$ | B-4 | B-4 |
| a-12 | H | H | H | H | B-5 | B-5 | B-5 | B-5 |
| a-13 | H | H | H | H | B-6 | B-6 | ph | ph |

Specific examples (Example Compound Nos. a-1 to a-43 and b-1 to b-39) of the Spiro compounds of the formulas (I-a) and (I-b) are enumerated in Tables 1–16 hereinafter separately for the respective preferred formulas (II-a) to (IX-a) and (II-b) to (IX-b) wherein some representative structures for the groups $L_1$ and $L_4$ are identified by symbols A-1 to A-15 and B-1 to B-16 shown above, and "Ph" represents a phenyl group.

Further, the respective numerals in parentheses for the groups $R_1$ to $R_4$ represent their substitution positions, respectively, specifically indicated in the formulas (II-a) to (IX-a) and (II-b) to (IX-b).

Incidentally, the spiro compounds according to the present invention inclusive of those enumerated below are

TABLE 3

Formula (IV-a)

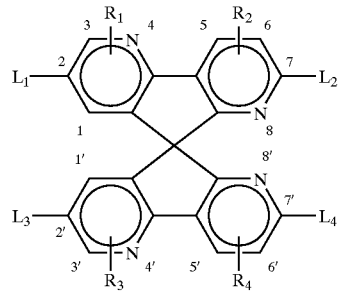

| No. | R₁ | R₂ | R₃ | R₄ | L₁ | L₂ | L₃ | L₄ |
|---|---|---|---|---|---|---|---|---|
| a-14 | H | H | H | H | A-2 | A-2 | A-2 | A-2 |
| a-15 | H | H | H | H | A-8 | A-8 | A-8 | A-8 |
| a-16 | H | H | H | H | A-13 | A-13 | A-13 | A-13 |
| a-17 | H | ph(6) | H | ph(6) | B-7 | H | B-7 | H |
| a-18 | H | H | H | H | NO₂ | B-8 | NO₂ | B-8 |
| a-19 | H | H | H | H | B-9 | B-9 | B-9 | B-9 |

TABLE 4

Formula (V-a)

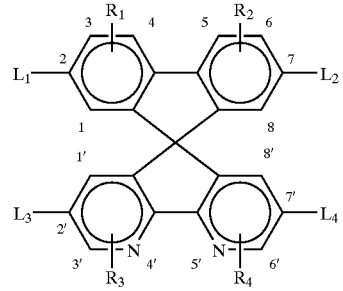

| No. | R₁ | R₂ | R₃ | R₄ | L₁ | L₂ | L₃ | L₄ |
|---|---|---|---|---|---|---|---|---|
| a-20 | H | H | H | H | A-1 | A-1 | A-1 | A-1 |
| a-21 | H | H | H | H | A-3 | A-3 | A-3 | A-3 |
| a-22 | H | H | H | H | A-6 | A-6 | A-6 | A-6 |
| a-23 | H | H | H | H | A-10 | A-10 | A-10 | A-10 |
| a-24 | H | H | H | H | A-15 | A-15 | A-15 | A-15 |
| a-25 | H | H | H | H | B-10 | B-10 | B-10 | B-10 |
| a-26 | H | H | H | H | B-11 | B-11 | OCH₃ | OCH₃ |

TABLE 5

Formula (VI-a)

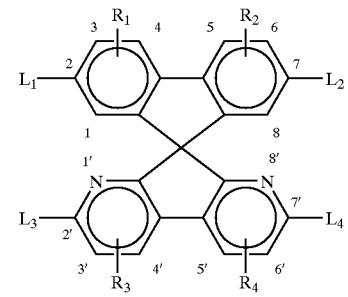

| No. | R₁ | R₂ | R₃ | R₄ | L₁ | L₂ | L₃ | L₄ |
|---|---|---|---|---|---|---|---|---|
| a-27 | H | H | H | H | A-3 | A-3 | A-3 | A-3 |
| a-28 | H | H | H | H | A-7 | A-7 | A-7 | A-7 |
| a-29 | H | H | H | H | A-15 | A-15 | A-15 | A-15 |
| a-30 | CH₃ (3) | CH₃ (6) | CH₃ (3') | CH₃ (6') | (CH₂)₃CH₃ | (CH₂)₃CH₃ | B-12 | B-12 |
| a-31 | H | H | H | H | B-13 | B-13 | B-13 | B-13 |
| a-32 | H | H | H | H | B-14 | B-14 | H | H |

TABLE 6

Formula (VII-a)

| No. | R$_1$ | R$_2$ | R$_3$ | R$_4$ | L$_1$ | L$_2$ | L$_3$ | L$_4$ |
|---|---|---|---|---|---|---|---|---|
| a-33 | H | H | H | H | A-2 | A-2 | A-2 | A-2 |
| a-34 | H | H | H | H | A-5 | A-5 | A-5 | A-5 |
| a-35 | H | H | H | H | A-13 | A-13 | A-13 | A-13 |
| a-36 | CH$_3$ (1) | CH$_3$ (8) | H | H | H | H | B-15 | B-15 |
| a-37 | H | H | H | H | B-16 | B-16 | H | H |

TABLE 7

Formula (VIII-a)

| No. | R$_1$ | R$_2$ | R$_3$ | R$_4$ | L$_1$ | L$_2$ | L$_3$ | L$_4$ |
|---|---|---|---|---|---|---|---|---|
| a-38 | H | H | H | H | A-1 | A-1 | A-1 | A-1 |
| a-39 | H | H | H | H | A-4 | A-4 | A-4 | A-4 |
| a-40 | H | H | H | H | B-1 | B-1 | B-1 | B-1 |

TABLE 8

Formula (IX-a)

| No. | R$_1$ | R$_2$ | R$_3$ | R$_4$ | L$_1$ | L$_2$ | L$_3$ | L$_4$ |
|---|---|---|---|---|---|---|---|---|
| a-41 | H | H | H | H | A-2 | A-2 | A-2 | A-2 |
| a-42 | H | H | H | H | A-6 | A-6 | A-6 | A-6 |
| a-43 | H | H | H | H | A-12 | A-12 | A-12 | A-12 |

TABLE 9

Formula (II-b)

| No. | R$_1$ | R$_2$ | R$_3$ | R$_4$ | L$_1$ | L$_2$ | L$_3$ | L$_4$ |
|---|---|---|---|---|---|---|---|---|
| b-1 | H | H | H | H | A-1 | A-1 | A-1 | A-1 |
| b-2 | H | H | H | H | A-4 | A-4 | A-4 | A-4 |
| b-3 | H | H | H | H | A-11 | A-11 | A-11 | A-11 |
| b-4 | CH$_3$ (3) | CH$_3$ (6) | CH$_3$ (3') | CH$_3$ (6') | B-1 | B-1 | B-1 | B-1 |
| b-5 | H | H | H | H | B-2 | B-2 | B-2 | B-2 |
| b-6 | H | H | H | H | B-3 | B-3 | B-3 | B-3 |

TABLE 10

Formula (III-b)

| No. | R$_1$ | R$_2$ | R$_3$ | R$_4$ | L$_1$ | L$_2$ | L$_3$ | L$_4$ |
|---|---|---|---|---|---|---|---|---|
| b-8 | H | H | H | H | A-5 | A-5 | A-5 | A-5 |
| b-9 | H | H | H | H | A-6 | A-6 | A-6 | A-6 |
| b-10 | H | H | H | H | A-12 | A-12 | A-12 | A-12 |
| b-11 | H | H | H | H | CH$_2$CH$_3$ | CH$_2$CH$_3$ | B-4 | B-4 |
| b-12 | H | H | H | H | B-5 | B-5 | B-5 | B-5 |
| b-13 | H | H | H | H | B-6 | B-6 | ph | ph |

TABLE 11

Formula (IV-b)

| No. | R$_1$ | R$_2$ | R$_3$ | R$_4$ | L$_1$ | L$_2$ | L$_3$ | L$_4$ |
|---|---|---|---|---|---|---|---|---|
| b-14 | H | H | H | H | A-2 | A-2 | A-2 | A-2 |
| b-15 | H | H | H | H | A-8 | A-8 | A-8 | A-8 |

TABLE 11-continued

Formula (IV-b)

| No. | R₁ | R₂ | R₃ | R₄ | L₁ | L₂ | L₃ | L₄ |
|---|---|---|---|---|---|---|---|---|
| b-16 | H | H | H | H | A-13 | A-13 | A-13 | A-13 |
| b-17 | H | H | H | H | B-7 | B-7 | B-7 | B-7 |
| b-18 | H | H | H | H | NO₂ | NO₂ | NO₂ | NO₂ |
| b-19 | H | H | H | H | B-8 | B-8 | B-8 | B-8 |

TABLE 12

Formula (V-b)

| No. | R₁ | R₂ | R₃ | R₄ | L₁ | L₂ | L₃ | L₄ |
|---|---|---|---|---|---|---|---|---|
| b-20 | H | H | H | H | A-1 | A-1 | A-1 | A-1 |
| b-21 | H | H | H | H | A-3 | A-3 | A-3 | A-3 |
| b-22 | H | H | H | H | A-10 | A-10 | A-10 | A-10 |
| b-23 | H | H | H | H | B-9 | B-9 | B-9 | B-9 |
| b-24 | H | H | H | H | B-10 | B-10 | OCH₃ | OCH₃ |

TABLE 13

Formula (VI-b)

| No. | R₁ | R₂ | R₃ | R₄ | L₁ | L₂ | L₃ | L₄ |
|---|---|---|---|---|---|---|---|---|
| b-25 | H | H | H | H | A-3 | A-3 | A-3 | A-3 |
| b-26 | H | H | H | H | A-7 | A-7 | A-7 | A-7 |
| b-27 | H | H | H | H | A-15 | A-15 | A-15 | A-15 |
| b-28 | H | H | H | H | B-11 | B-11 | B-11 | B-11 |
| b-29 | H | H | H | H | B-12 | B-12 | H | H |

TABLE 14

Formula (VII-b)

| No. | R₁ | R₂ | R₃ | R₄ | L₁ | L₂ | L₃ | L₄ |
|---|---|---|---|---|---|---|---|---|
| b-30 | H | H | H | H | A-2 | A-2 | A-2 | A-2 |
| b-31 | H | H | H | H | A-5 | A-5 | A-5 | A-5 |
| b-32 | H | H | H | H | A-13 | A-13 | A-13 | A-13 |
| b-33 | CH₃ (1) | CH₃ (8) | H | H | H | H | B-13 | B-13 |

TABLE 15

Formula (VIII-b)

| No. | R₁ | R₂ | R₃ | R₄ | L₁ | L₂ | L₃ | L₄ |
|---|---|---|---|---|---|---|---|---|
| b-34 | H | H | H | H | A-1 | A-1 | A-1 | A-1 |
| b-35 | H | H | H | H | A-4 | A-4 | A-4 | A-4 |
| b-36 | H | H | H | H | B-14 | B-14 | B-14 | B-14 |

TABLE 16

Formula (IX-b)

| No. | R₁ | R₂ | R₃ | R₄ | L₁ | L₂ | L₃ | L₄ |
|---|---|---|---|---|---|---|---|---|
| b-37 | H | H | H | H | A-2 | A-2 | A-2 | A-2 |
| b-38 | H | H | H | H | A-7 | A-7 | A-7 | A-7 |
| b-39 | H | H | H | H | A-12 | A-12 | A-12 | A-12 |

In the organic luminescence device of the present invention, the organic compound layer(s) comprising the above-mentioned spiro compound of the formula (I-a) or (I-b) may be formed between the pair of anode and cathode (electrodes) by vacuum deposition or wet-coating process. The organic compound layer(s) may preferably be formed in a (total) thickness of at most 10 μm, more preferably at most 0.5 μm, further preferably 0.01–0.5 μm.

Figure 2:
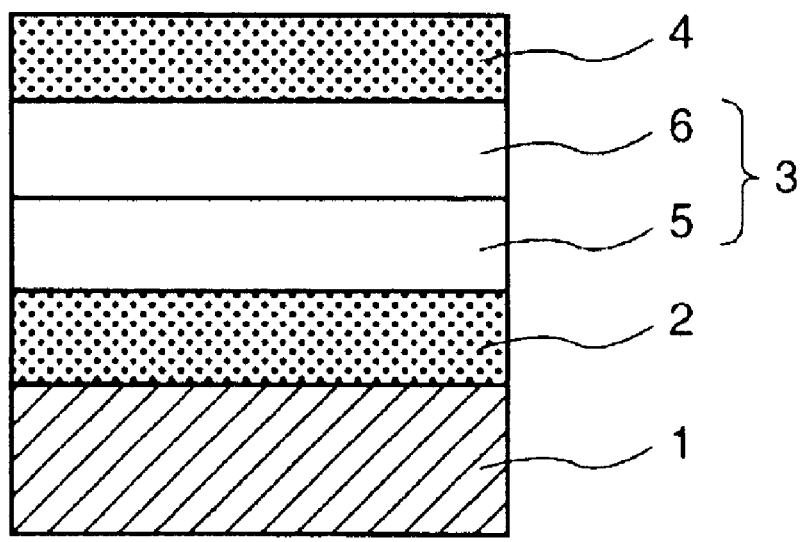
Figure 3:
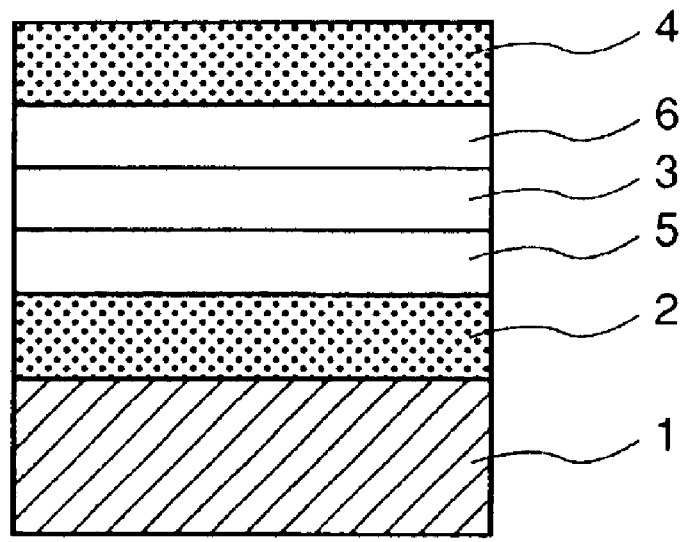
Figure 4:
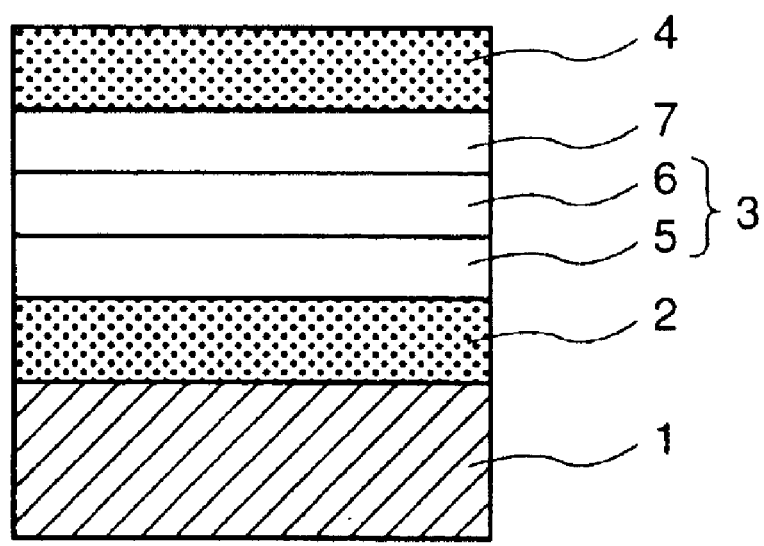

The organic compound layer(s) constituting the organic luminescence device of the present invention may have a single-layer structure as shown in FIG. 1 or a laminate structure of two or more layers as shown in FIGS. 2, 3 and 4.

More specifically, FIG. 1 is a schematic sectional view illustrating an embodiment of the organic luminescence device of the present invention. Referring to FIG. 1, the organic luminescence device includes a substrate 1, and an anode 2, a luminescence layer 3 and a cathode disposed in this order on the substrate 1 so as to form a laminate structure. The luminescence layer 3 may comprise a single species of luminescent material exhibiting a hole-transporting function, an electron-transporting function and a luminescence function in combination or a mixture of plural compounds exhibiting these functions, respectively. The luminescence layer 3 may have a thickness of 5 nm to 1 μm, preferably 10–500 nm.

FIG. 2 is a sectional view showing a laminate structure of another embodiment of the organic luminescence device. Referring to FIG. 2, the organic luminescence device includes a substrate 1, and an anode 2, a hole-transporting layer 5, an electron-transporting layer 6 and a cathode 4 disposed successively in this order on the substrate 1 so as to form a laminate structure. In this case, either one or both of the hole-transporting layer 5 and the electron-transporting layer 6 may contain a luminescent material also having a hole-transporting function and/or an electron-transporting function, respectively, for constituting a luminescence layer 3 in combination. One of the layers 6 and 5 may contain a material having no luminescent function but having a good electron-transporting or hole-transporting function. Each of the hole-transporting layer 5 and the electron-transporting layer 6 may have a thickness of 5 nm to 1 μm, preferably 10–500 nm.

FIG. 3 is a sectional view showing still another embodiment of the organic luminescence device of the present invention. Referring to FIG. 3, the organic luminescence device includes a substrate 1, and an anode 2, a hole-transporting layer 5, a luminescence layer 3, an electron-transporting layer 6 and a cathode 4 disposed successively in this order on the substrate 1 to form a laminate structure. In this embodiment, the carrier transporting functions and the luminescent function of the organic compound layer are separated and assigned to the respective layers. Each of the hole-transporting layer 5, the luminescence layer 3 and the electron-transporting layer 6 may contain a single species or plural species of compounds showing respectively expected functions so as to exhibit desired performances. More specifically, in the case of using plural species of compounds in combination, a lot of latitude is provided in selection of materials for each layer, and various compounds having different emission wavelengths can be used to provide a variety of luminescence hues.

Further, as the carriers and excitons are effectively confined in the central luminescence layer 3, it is possible to increase the luminescence efficiency.

In the embodiment of FIG. 3, each of the hole-transporting layer 5, the luminescence layer 3 and the electron-transporting layer 6 may have a thickness of 5 nm–1 μm, preferably 10–500 nm.

FIG. 4 is a sectional view showing another embodiment of the organic luminescence device. Referring to FIG. 4, the organic luminescence device includes a substrate 1, and an anode 2, a hole-transporting layer 5, an electron-transporting layer 6, an electron injection layer 7 and a cathode 4 disposed successively in this order on the substrate 1 so as to form a laminate structure. The electron injection layer 7 is disposed in order to efficiently inject electrons from the cathode 4 into the electron-transporting layer 6, thus functionally separating an electron injection performance and an electron-transporting performance, respectively, rom the cathode 4. Each of the hole-transporting layer 5, the electron-transporting layer 6 and the electron injection layer 7 may have a thickness of 5 nm to 1 μm, preferably 10–500 nm.

It is to be understood however that FIGS. 1–4 described above merely show basic structures of the organic luminescence device according to the present invention, and various modifications thereof are possible. For example, between the organic compound layer(s) and the electrodes (anode and cathode), it is possible to dispose an insulating layer, an adhesive layer, or an interference layer. Further, the hole-transporting layer 5 can be divided into two layers with different ionization potentials.

The spiro compound represented by the formula (I-a) or (I-b) have better electron injection performance, electron-transporting performance, luminescence performance and durability than conventional compounds and can be adopted in any of the device structures shown in FIGS. 1 to 4.

The organic compound layer containing the spiro compound of the formula (I-a) or (I-b) is particularly useful as an electron injection layer, an electron-transporting layer and/or a luminescence layer. A layer thereof may be formed by vacuum deposition or solution coating in a form which is not liable to crystallize and is excellent in stability with time.

In the present invention, the Spiro compound of the formula (I-a) or (I-b) can be used to constitute an electron injection layer, an electron-transporting layer and/or a luminescence layer, as desired, in combination with a known hole-transporting compound, luminescent compound or electron-transporting compound, examples of which are enumerated hereinbelow.

[Hole-transporting materials (low-molecular weight)]
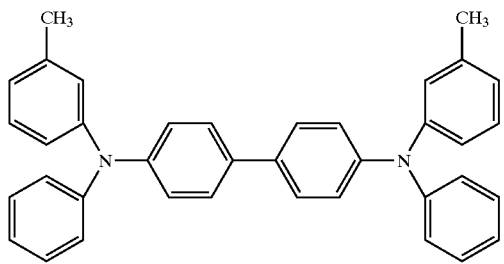
TPD
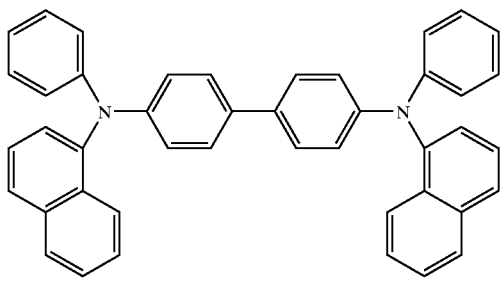
α-NPD
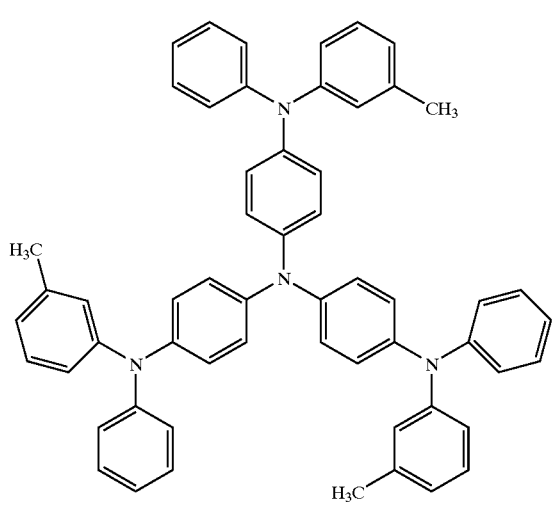
m-MTDATA
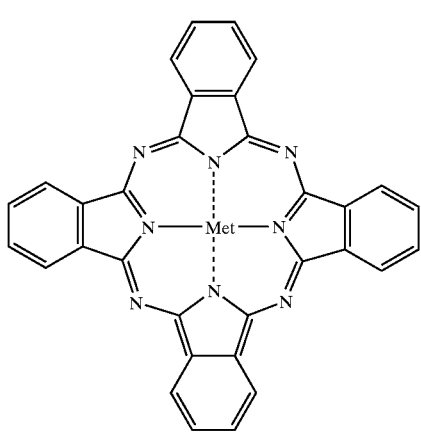
Met: Cu, Mg, AlCl, TiO$_2$, SnCl$_2$ etc
Met-Pc
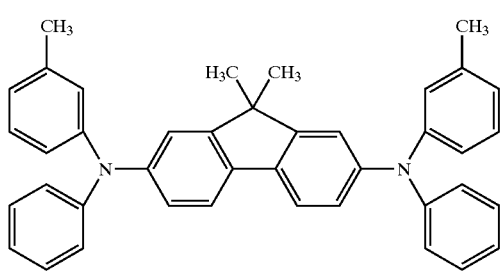
DTDPFL
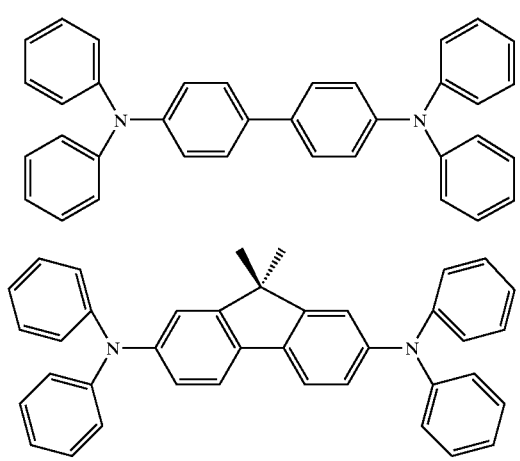
spiro-TPD
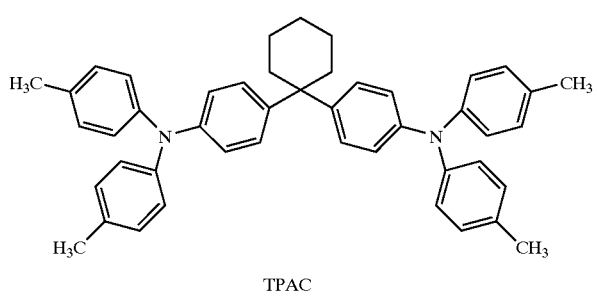
TPAC
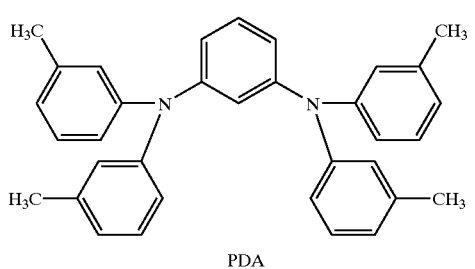
PDA

[Hole-transporting material (polymeric)]
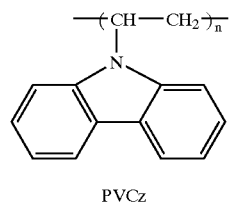
PVCz
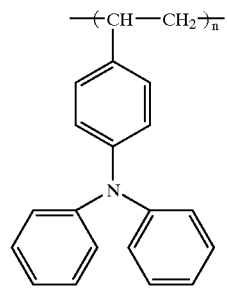
DPA-PS
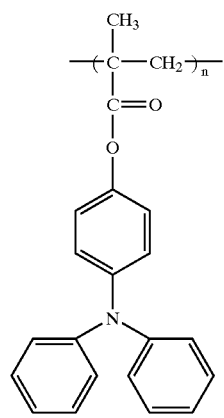
TPA-PMMA
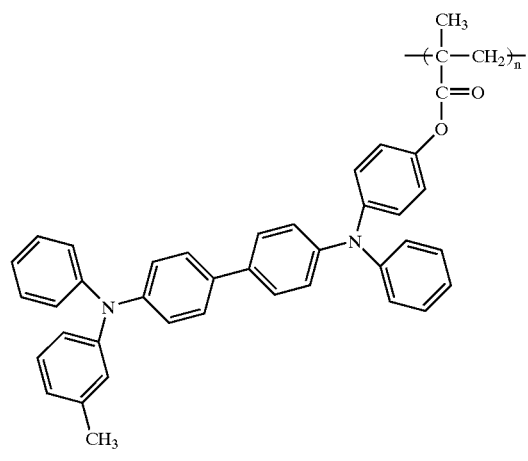
TPD-PMMA
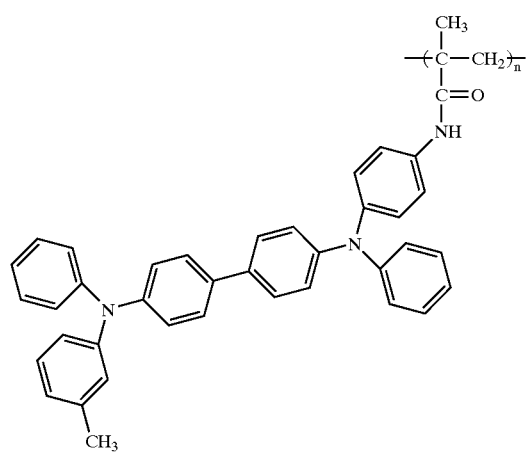
TPD-PMAA
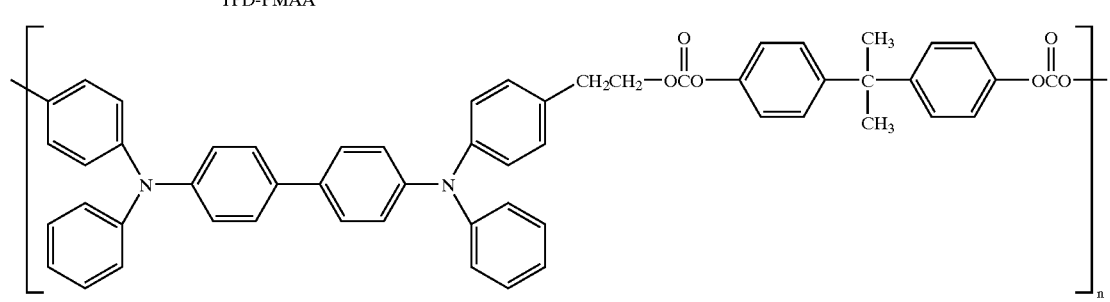
TPD-PCA

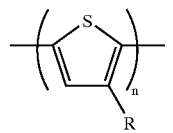
R: $C_6H_{13}$, $C_8H_{17}$, $C_{12}H_{25}$
Poly thiophene
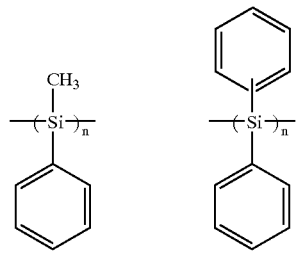
Poly silane
[Electron-transporting (luminescent) materials]
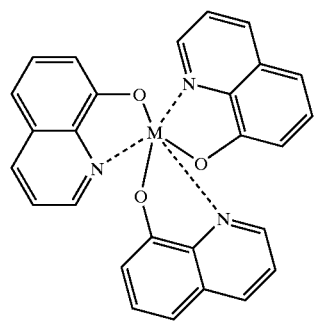
M: Al, Ga
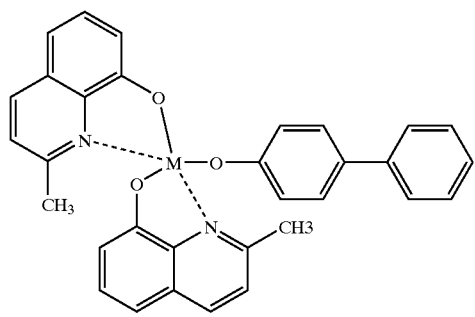
M: Al, Ga
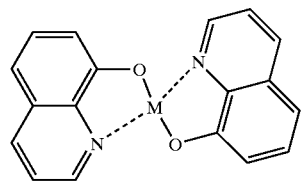
M: Zn, Mg, Be
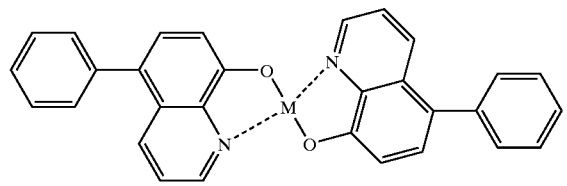
M: Zn, Mg, Be
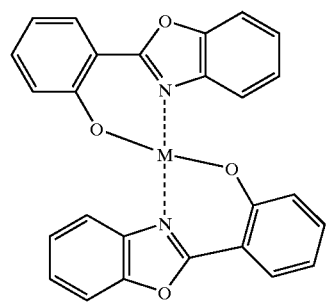
M: Zn, Mg, Be
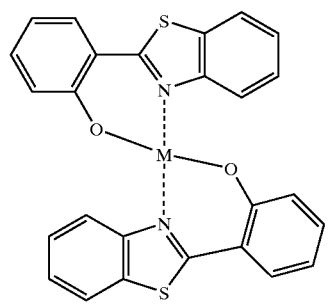
M: Zn, Mg, Be

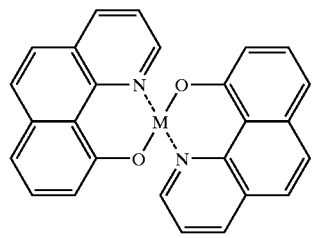
M: Zn, Mg, Be
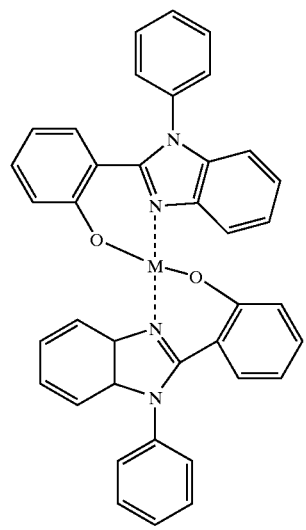
M: Zn, Mg, Be
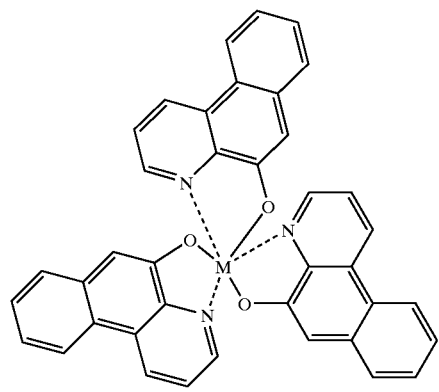
M: Al, Ga
[Electron-transporting (luminescent) materials]
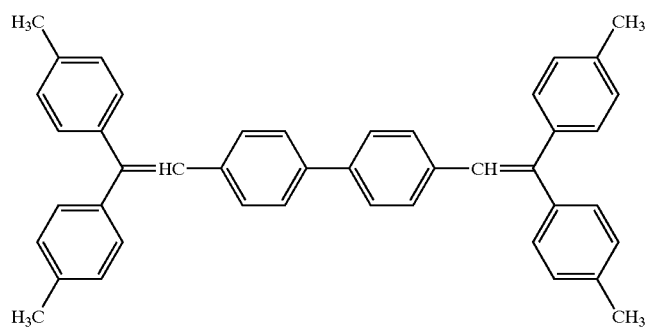

-continued
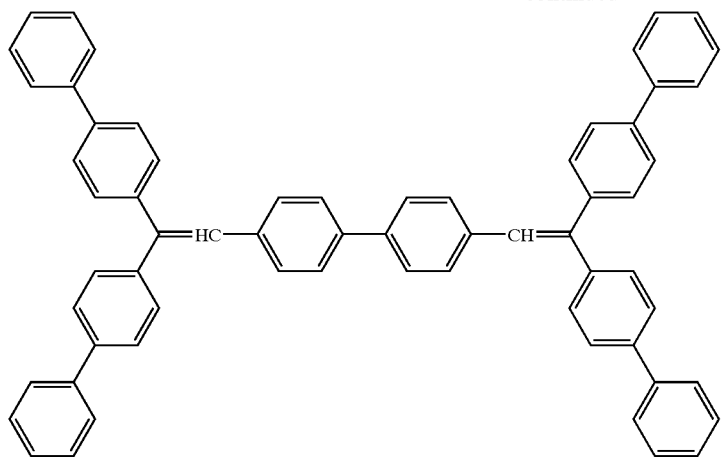
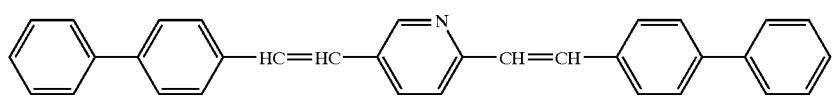
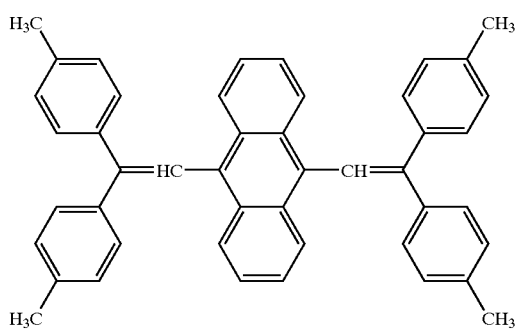
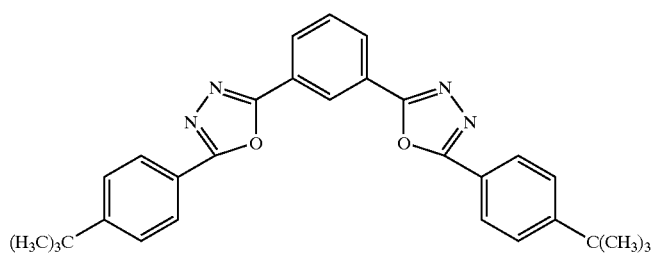
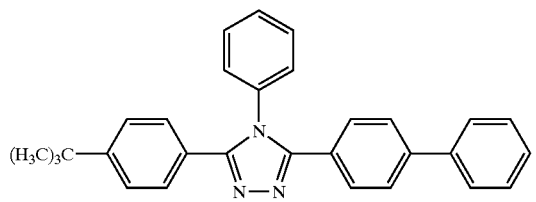
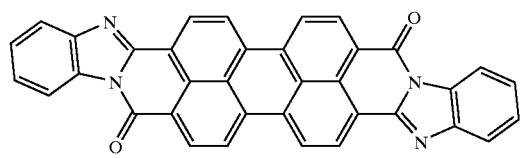
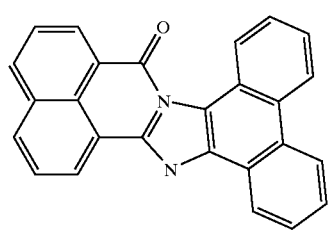
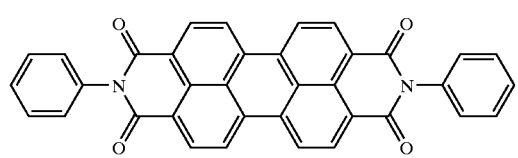

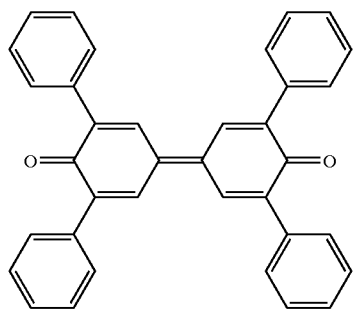
[Polymeric luminescent materials]
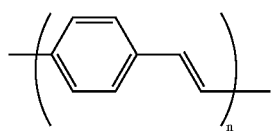
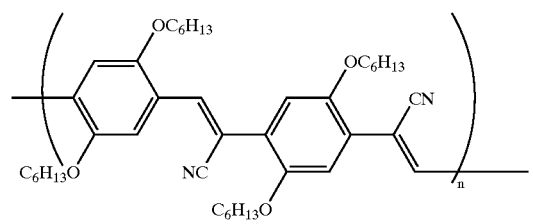
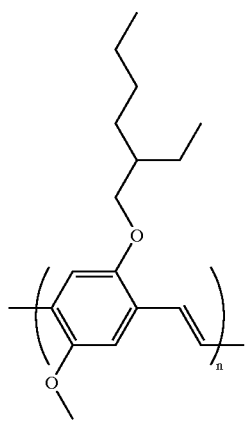
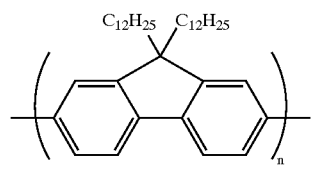
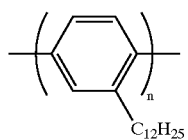
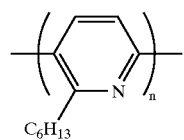
[Dopant]
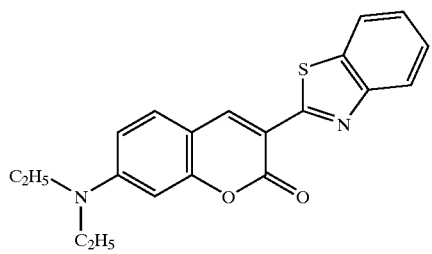
Coumarin6
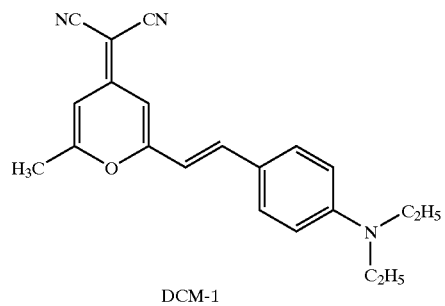
DCM-1

-continued

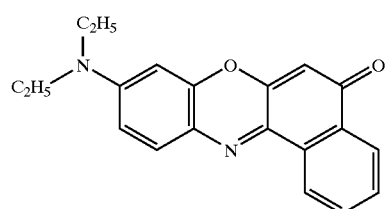

Nile red

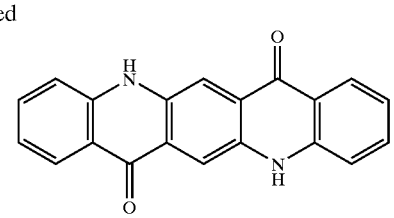

Quinacridone

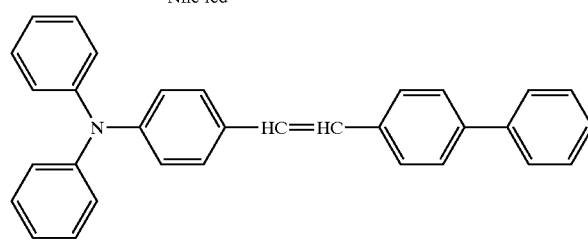

DTPABVi

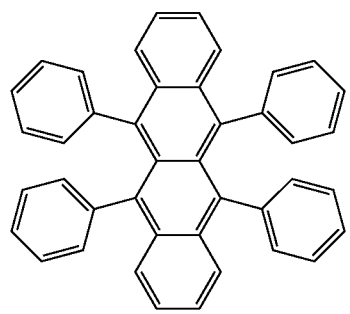

Rubrene

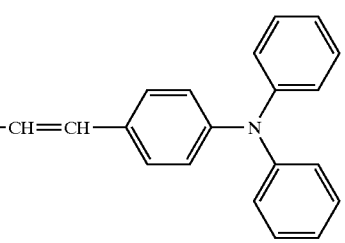

Coronene

As mentioned above, the organic compound layer(s) containing the spiro compound of the formula (I-a) or (I-b) or other organic compound layers may be formed into film by vacuum deposition or coating of a solution of the relevant compound in an appropriate solvent. In the case of the solution coating, the organic compound can be used in mixture with an appropriate binder resin to form a film.

The binder resin used for the above purpose may be selected from a wide variety of scope. Examples thereof may include: polyvinyl carbazole resin, polycarbonate resin, polyester resin, polyarylate resin, polystyrene resin, acrylic resin, methacrylic resin, butyral resin, polyvinyl acetal resin, diallyl phthalate resin, phenolic resin, epoxy resin, silicone resin, polysulfone resin, and urea resin. These resins may be used singly or in combination of two or more species or in the form of copolymers.

As a material for the anode (2 shown in FIGS. 1–4), it is preferred to use one having as large a work function as possible, examples of which may include: metals, such as gold, platinum, nickel, palladium, cobalt, selenium and vanadium, and their alloys; metal oxides, such as tin oxide, zinc oxide, indium tin oxide (ITO), and indium zinc oxide; and electroconductive polymers, such as polyaniline, polypyrrole, polythiophene, and polyphenylene sulfide. These compounds may be used singly or in combination of two or more species.

On the other hand, as a material for the cathode 4 shown in FIGS. 1–4, it is preferred to use one having a small work function, examples of which may include: metals, such as lithium, sodium, potassium, calcium, magnesium, aluminum, indium, silver, lead, tin and chromium, and their alloys. It is also possible to use metal oxide, such as indium tin oxide (ITO). The cathode may be formed in a single layer or a lamination of plural layers.

The substrate 1 shown in FIGS. 1–4 for the organic luminescence device of the present invention may include an opaque substrate of metal, ceramics, etc., and a transparent substrate of glass, quartz, plastics, etc. It is possible to form the substrate with a color filter film, a fluorescent color conversion film, a dielectric reflection film, etc., thus controlling emitted luminescent light.

In order to prevent contact with oxygen and/or moisture, the organic luminescence device of the present invention may further include a protective layer or a sealing layer. Examples of the protective layer may include: an inorganic film of diamond, metal oxide, metal nitride, etc.; a polymer film of fluorine-containing resin, polyparaxylene, polyethylene, silicone resin, polystyrene, etc., and a film of light-curable resin. It is also possible to effect packaging of the organic luminescence device per se with a sealing resin while covering the organic luminescence device with glass, gas-impermeable film, metal, etc.

Hereinbelow, the present invention will be described more specifically based on Examples.

EXAMPLE A-1

An electroluminescence device of a structure as shown in FIG. 2 was prepared in the following manner.

A 0.7 mm-thick glass substrate (substrate 1) coated with a 120 nm-thick film of ITO (indium tin oxide) (anode 2) formed by sputtering was successively washed with acetone and isopropyl alcohol (IPA) under application of ultrasonic wave and then washed with IPA under boiling, followed by cleaning by UV/ozone (i.e., irradiation with ultraviolet rays in the ozone-containing atmosphere), to obtain a transparent conductive substrate (including the substrate 1 and the ITO anode 2 formed thereon).

The transparent conductive substrate was coated by vacuum deposition of a compound (TPD) represented by a structural formula shown below:

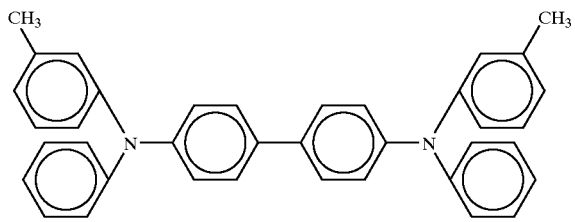

to form a 70 nm-thick hole-transporting layer 5 and then by vacuum deposition of a spiro compound (Example Compound No. a-1 listed in Table 1) to form a 70 nm-thick electron-transporting layer 6. The vacuum deposition was respectively performed in a vacuum of $1.0 \times 10^{-4}$ Pa and at a film thickness growth rate of 0.2–0.3 nm/sec.

Then, the electron-transporting layer 6 was further coated by vacuum deposition of Al—Li alloy (Li content: 1 atom %) to form a 150 nm-thick metal film (cathode 4) under a vacuum of $1.0 \times 10^{-4}$ Pa and at a film thickness growth rate of 1.0–1.2 nm/sec, thereby forming an organic luminescence device of a structure shown in FIG. 2.

The thus-obtained device was then supplied with a DC voltage of 8 volts between the ITO electrode 2 as an anode and the Al—Li alloy electrode 4 as a cathode, whereby a current flowed at a density of 8.5 mA/cm$^2$ and red luminescence was observed at a luminance of 600 cd/m$^2$. The device was further subjected to 100 hours of continuous voltage application at a constant current density of 7.0 mA/cm$^2$ in a nitrogen atmosphere, whereby the device initially exhibited a luminance of 520 cd/m$^2$, which was lowered to 490 cd/m$^2$ after 100 hours, thus showing only a small luminance deterioration.

The results are shown in Table 17 set forth hereinafter.

EXAMPLES A-2 to A-20

Organic luminescence devices were prepared and evaluated in the same manner as in Example A-1 except for replacing the Spiro compound (Ex. Comp. No. a-1) with those shown in Table 17, respectively.

The results are inclusively shown in Table 17 set forth hereinafter.

COMPARATIVE EXAMPLES A-1 to A-3

Comparative organic luminescence devices were prepared and evaluated in the same manner as in Example A-1 except for using Comparative Compound Nos. 1–3, respectively, shown below, instead of the spiro compound (Ex. Comp. No. a-1). The results are also shown in Table 17.

Comparative Compound No.1 (embraced in Formula (IV) of JP-A 7-278537)

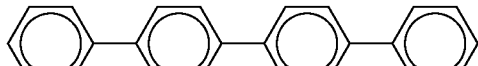

Comparative Compound No. 2 (JP-A 9-87616)

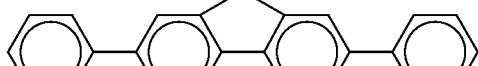

Comparative Compound No. 3 (JP-A 7-53951)

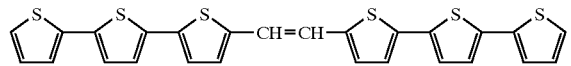

TABLE 17

| Example | Example Compound No. | Initial Voltage (V) | Initial Luminance (cd/m$^2$) | Luminance (at 7.0 mA/cm$^2$) Initial (cd/m$^2$) | After 100 hrs. (cd/m$^2$) |
|---|---|---|---|---|---|
| A-1 | a-1 | 8 | 600 | 520 | 490 |
| 2 | a-4 | 8 | 540 | 500 | 460 |
| 3 | a-7 | 8 | 340 | 290 | 240 |
| 4 | a-9 | 8 | 440 | 400 | 360 |
| 5 | a-10 | 8 | 530 | 495 | 460 |
| 6 | a-13 | 8 | 200 | 165 | 135 |
| 7 | a-14 | 8 | 565 | 510 | 475 |
| 8 | a-17 | 8 | 180 | 150 | 120 |
| 9 | a-21 | 8 | 420 | 385 | 335 |
| 10 | a-22 | 8 | 470 | 430 | 385 |
| 11 | a-26 | 8 | 190 | 140 | 115 |
| 12 | a-27 | 8 | 515 | 475 | 440 |
| 13 | a-29 | 8 | 530 | 495 | 460 |
| 14 | a-32 | 8 | 195 | 160 | 135 |
| 15 | a-33 | 8 | 560 | 485 | 445 |
| 16 | a-36 | 8 | 160 | 140 | 115 |
| 17 | a-38 | 8 | 530 | 480 | 440 |
| 18 | a-40 | 8 | 170 | 145 | 105 |
| 19 | a-42 | 8 | 450 | 415 | 380 |
| 20 | a-43 | 8 | 525 | 480 | 450 |
| | Compound No. | | | | |
| Comp. A-1 | Comp. No. 1 | 8 | 20 | 15 | ** |
| Comp. A-2 | Comp. No. 2 | 8 | 60 | 40 | 10 |
| Comp. A-3 | Comp. No. 3 | 8 | 15 | 10 | ** |

**: No luminescence

EXAMPLE A-21

The procedure of Example A-1 was repeated up to the formation of the hole-transporting layer 5.

Then, the hole-transporting layer 5 was further coated by vacuum deposition of a mixture of spiro compound (Ex. Compound No. a-2) and aluminum tris(quinolinol) in a weight ratio of 1:20 to form a 70 nm-thick electron-transporting layer 6 under a vacuum of $1.0 \times 10^{-4}$ Pa and at a film thickness growth rate of 0.2–0.3 nm/sec.

Then, the electron-transporting layer 6 was further coated by vacuum deposition of Al—Li alloy (Li content: 1 atom. %) to form a 150 nm-thick metal film 4 under a vacuum of $1.0 \times 10^{-4}$ Pa and at a film thickness growth rate of 1.0–1.2 nm/sec, thereby forming an organic luminescence device of a structure shown in FIG. 2.

The thus-obtained device was then supplied with a DC voltage of 8 volts between the ITO electrode 2 as an anode and the Al—Li alloy electrode 4 as a cathode, whereby a current flowed at a density of 9.0 mA/cm$^2$ and orange luminescence was observed at a luminance of 830 cd/m$^2$. The device was further subjected to 100 hours of continuous voltage application at a constant current density of 7.0 mA/cm$^2$ in a nitrogen atmosphere, whereby the device initially exhibited a luminance of 640 cd/m$^2$, which was lowered to 590 cd/m$^2$ after 100 hours, thus showing only a small luminance deterioration.

The results are shown in Table 18 set forth hereinafter.

EXAMPLES A-22 to A-32

Organic luminescence devices were prepared and evaluated in the same manner as in Example A-21 except for replacing the spiro compound (Ex. Comp. No. a-2) with those shown in Table 18, respectively.

The results are inclusively shown in Table 18 set forth hereinafter.

COMPARATIVE EXAMPLES A-4 to A-6

Comparative organic compound devices were prepared and evaluated in the same manner as in Example A-21 except for using Comparative Compound Nos. 1–3, respectively, shown above, instead of the spiro compound (Ex. Comp. No. a-2). The results are also shown in Table 18.

TABLE 18

| Example | Compound No. | Voltage (V) | Initial Luminance (cd/m$^2$) | Luminance (at 7.0 mA/cm$^2$) Initial (cd/m$^2$) | After 100 hrs. (cd/m$^2$) |
|---|---|---|---|---|---|
| A-21 | a-2 | 8 | 830 | 640 | 590 |
| 22 | a-5 | 8 | 540 | 480 | 435 |
| 23 | a-11 | 8 | 505 | 460 | 430 |
| 24 | a-15 | 8 | 590 | 520 | 475 |
| 25 | a-18 | 8 | 490 | 455 | 405 |
| 26 | a-20 | 8 | 1020 | 810 | 750 |
| 27 | a-23 | 8 | 800 | 610 | 570 |
| 28 | a-25 | 8 | 530 | 480 | 440 |
| 29 | a-30 | 8 | 480 | 445 | 400 |
| 30 | a-34 | 8 | 780 | 600 | 565 |
| 31 | a-37 | 8 | 530 | 500 | 455 |
| 32 | a-39 | 8 | 680 | 580 | 540 |
| Comp. A-4 | Comp. No. 1 | 8 | 240 | 200 | 110 |
| Comp. A-5 | Comp. No. 2 | 8 | 300 | 240 | 95 |
| Comp. A-6 | Comp. No. 3 | 8 | 245 | 200 | 40 |

EXAMPLE A-33

The procedure of Example A-1 was repeated up to the formation of the hole-transporting layer 5.

Then, the hole-transporting layer 5 was further coated by vacuum deposition of aluminum tris(quinolinol) to form a 30 nm-thick luminescence layer 3 and then by vacuum deposition of a spiro compound (Ex. Compound No. a-8) to form a 50 nm-thick electron-transporting layer 6, respectively under a vacuum of $1.0 \times 10^{-4}$ Pa and at a film thickness growth rate of 0.2–0.3 nm/sec.

Then, the electron-transporting layer 6 was further coated by vacuum deposition of Al—Li alloy (Li content: 1 atom. %) to form a 150 nm-thick metal film 4 under a vacuum of $1.0 \times 10^{-4}$ Pa and at a film thickness growth rate of 1.0–1.2 nm/sec, thereby forming an organic luminescence device of a structure shown in FIG. 3.

The thus-obtained device was then supplied with a DC voltage of 10 volts between the ITO electrode 2 as an anode and the Al—Li alloy electrode 4 as a cathode, whereby a current flowed at a density of 12.0 mA/cm$^2$ and yellow luminescence was observed at a luminance of 1270 cd/m$^2$. The device was further subjected to 100 hours of continuous voltage application at a constant current density of 10.0 mA/cm$^2$ in a nitrogen atmosphere, whereby the device initially exhibited a luminance of 1080 cd/m$^2$, which was lowered to 990 cd/m$^2$ after 100 hours, thus showing only a small luminance deterioration.

The results are shown in Table 19 set forth hereinafter.

EXAMPLES A-34 to A-43

Organic luminescence devices were prepared and evaluated in the same manner as in Example A-33 except for replacing the spiro compound of (Ex. Comp. No. a-8) with those show in Table 19, respectively.

The results are inclusively shown in Table 19 set forth hereinafter.

COMPARATIVE EXAMPLES A-7 to A-9

Comparative organic luminescence devices were prepared and evaluated in the same manner as in Example A-33 except for using Comparative Compound Nos. 1–3, respectively, shown above, instead of the spiro compound Ex. Comp. No. a-8. The results are also shown in Table 19.

TABLE 19

| Example | Compound No. | Voltage (V) | Initial Luminance (cd/m$^2$) | Luminance (at 10.0 mA/cm$^2$) Initial (cd/m$^2$) | After 100 hrs. (cd/m$^2$) |
|---|---|---|---|---|---|
| A-33 | a-8 | 10 | 1270 | 1080 | 990 |
| 34 | a-3 | 10 | 1100 | 930 | 860 |
| 35 | a-6 | 10 | 860 | 720 | 640 |
| 36 | a-12 | 10 | 870 | 730 | 660 |
| 37 | a-16 | 10 | 1030 | 900 | 820 |
| 38 | a-19 | 10 | 830 | 690 | 650 |
| 39 | a-24 | 10 | 1280 | 1120 | 1010 |
| 40 | a-28 | 10 | 1070 | 920 | 860 |
| 41 | a-31 | 10 | 900 | 760 | 700 |
| 42 | a-35 | 10 | 1150 | 970 | 910 |
| 43 | a-41 | 10 | 1440 | 1230 | 1130 |
| Comp. A-7 | Comp. No. 1 | 10 | 120 | 100 | 30 |
| Comp. A-8 | Comp. No. 2 | 10 | 160 | 130 | 45 |
| Comp. A-9 | Comp. No. 3 | 10 | 50 | 35 | ** |

**: No luminescence.

EXAMPLE A-44

A transparent conductive substrate prepared and treated for cleaning in the same manner as in Example A-1 was coated with a solution of 0.050 g of a spiro compound (Ex.

Comp. No. a-1) and 1.00 g of poly-N-vinylcarbazole (weight-average molecular weight=63,000) in 80 ml of chloroform by spin coating at a rate of 2000 rpm, followed by drying, to form a 120 nm-thick luminescence layer 3.

Then, the luminescence layer 3 was further coated by vacuum deposition of Al—Li alloy (Li content: 1 atom %) to form a 150 nm-thick metal film 4 under a vacuum of $1.0 \times 10^{-4}$ Pa and at a film thickness growth rate of 1.0–1.2 nm/sec, thereby forming an organic luminescence device of a structure shown in FIG. 1.

The thus-obtained device was then supplied with a DC voltage of 10 volts between the ITO electrode 2 as an anode and the Al—Li alloy electrode 4 as a cathode, whereby a current flowed at a density of 9.5 mA/cm$^2$ and red luminescence was observed at a luminance of 450 cd/m$^2$.

COMPARATIVE EXAMPLE A-10

An organic luminescence device was prepared in the same manner as in Example A-44 except for using Comparative Compound No. 2 instead of the spiro compound Ex. Comp. No. a-1.

The resultant device was similarly supplied with a DC voltage of 10 volts, whereby a current followed at a density of 9.0 mA/cm$^2$ and yellow-green luminescence was observed at a luminance of 30 cd/m$^2$.

EXAMPLE B-1

An electroluminescence device of a structure as shown in FIG. 2 was prepared in the following manner.

A 0.7 mm-thick glass substrate (substrate 1) coated with a 120 nm-thick film of ITO (indium tin oxide) (anode 2) formed by sputtering was successively washed with acetone and isopropyl alcohol (IPA) under application of ultrasonic wave and then washed with IPA under boiling, followed by cleaning by UV/ozone (i.e., irradiation with ultraviolet rays in the ozone-containing atmosphere), to obtain a transparent conductive substrate (including the substrate 1 and the ITO anode 2 formed thereon).

The transparent conductive substrate was coated by vacuum deposition of a compound (TPD) represented by a structural formula shown below:

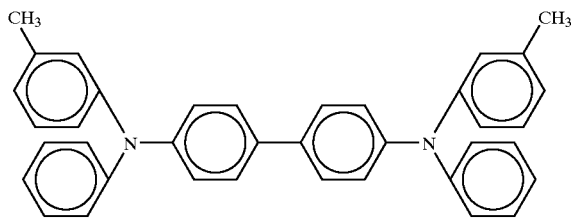

to form a 70 nm-thick hole-transporting layer 5 and then by vacuum deposition of a spiro compound (Example Compound No. b-1 listed in Table 9) to form a 70 nm-thick electron-transporting layer 6. The vacuum deposition was respectively performed in a vacuum of $1.0 \times 10^{-4}$ Pa and at a film thickness growth rate of 0.2–0.3 nm/sec.

Then, the electron-transporting layer 6 was further coated by vacuum deposition of Al—Li alloy (Li content: 1 atom %) to form a 150 nm-thick metal film (cathode 4) under a vacuum of $1.0 \times 10^{-4}$ Pa and at a film thickness growth rate of 1.0–1.2 nm/sec, thereby forming an organic luminescence device of a structure shown in FIG. 2.

The thus-obtained device was then supplied with a DC voltage of 8 volts between the ITO electrode 2 as an anode and the Al—Li alloy electrode 4 as a cathode, whereby a current flowed at a density of 8.0 mA/cm$^2$ and red luminescence was observed at a luminance of 560 cd/m$^2$. The device was further subjected to 100 hours of continuous voltage application at a constant current density of 7.0 mA/cm$^2$ in a nitrogen atmosphere, whereby the device initially exhibited a luminance of 510 cd/m$^2$, which was lowered to 485 cd/m$^2$ after 100 hours, thus showing only a small luminance deterioration.

The results are shown in Table 20 set forth hereinafter.

EXAMPLES B-2 to B-17

Organic luminescence devices were prepared and evaluated in the same manner as in Example B-1 except for replacing the spiro compound (Ex. Comp. No. b-1) with those shown in Table 20, respectively.

The results are inclusively shown in Table 20 set forth hereinafter.

COMPARATIVE EXAMPLES B-1 and B-2

Comparative organic luminescence devices were prepared and evaluated in the same manner as in Example B-1 except for using Comparative Compound Nos. 1 and 2, respectively, shown below, instead of the spiro compound (Ex. Comp. No. b-1). The results are also shown in Table 20.

Comparative Compound No.1 (embraced in Formula (IV) of JP-A 7-278537)

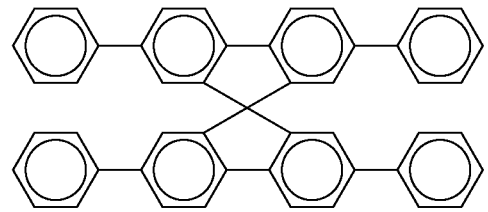

Comparative Compound No. 2 (JP-A 9-87616)

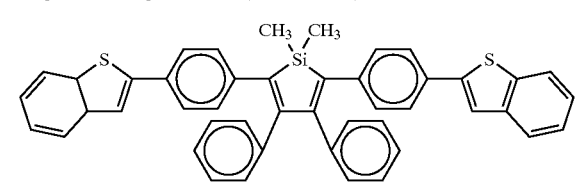

TABLE 20

| | | | | Luminance (at 7.0 mA/cm$^2$) | |
|---|---|---|---|---|---|
| Example | | Initial | | | |
| Example | Compound No. | Voltage (V) | Luminance (cd/m$^2$) | Initial (cd/m$^2$) | After 100 hrs. (cd/m$^2$) |
| B-1 | b-1 | 8 | 560 | 510 | 485 |
| 2 | b-3 | 8 | 540 | 500 | 470 |
| 3 | b-7 | 8 | 350 | 310 | 245 |
| 4 | b-9 | 8 | 530 | 480 | 455 |
| 5 | b-10 | 8 | 535 | 495 | 460 |
| 6 | b-12 | 8 | 230 | 210 | 190 |
| 7 | b-14 | 8 | 590 | 540 | 495 |
| 8 | b-17 | 8 | 190 | 160 | 140 |
| 9 | b-21 | 8 | 490 | 470 | 435 |
| 10 | b-23 | 8 | 370 | 330 | 285 |
| 11 | b-26 | 8 | 490 | 460 | 415 |
| 12 | b-27 | 8 | 510 | 475 | 440 |
| 13 | b-29 | 8 | 230 | 195 | 160 |
| 14 | b-31 | 8 | 500 | 460 | 430 |
| 15 | b-33 | 8 | 260 | 230 | 200 |

TABLE 20-continued

| Example | | Initial | | Luminance (at 7.0 mA/cm$^2$) | |
|---|---|---|---|---|---|
| Example | Compound No. | Voltage (V) | Luminance (cd/m$^2$) | Initial (cd/m$^2$) | After 100 hrs. (cd/m$^2$) |
| 16 | b-35 | 8 | 490 | 460 | 420 |
| 17 | b-38 | 8 | 530 | 490 | 445 |
| Comp. B-1 | Comp. No. 1 | 8 | 20 | 15 | ** |
| Comp. B-2 | Comp. No. 2 | 8 | 60 | 40 | 10 |

**: No luminescence

EXAMPLE B-21

The procedure of Example B-1 was repeated up to the formation of the hole-transporting layer 5.

Then, the hole-transporting layer 5 was further coated by vacuum deposition of a mixture of spiro compound (Ex. Compound No. b-2) and aluminum tris(quinolinol) in a weight ratio of 1:20 to form a 70 nm-thick electron-transporting layer 6 under a vacuum of 1.0×10$^{-4}$ Pa and at a film thickness growth rate of 0.2–0.3 nm/sec.

Then, the electron-transporting layer 6 was further coated by vacuum deposition of Al—Li alloy (Li content: 1 atom. %) to form a 150 nm-thick metal film 4 under a vacuum of 1.0×10$^{-4}$ Pa and at a film thickness growth rate of 1.0–1.2 nm/sec, thereby forming an organic luminescence device of a structure shown in FIG. 2.

The thus-obtained device was then supplied with a DC voltage of 8 volts between the ITO electrode 2 as an anode and the Al—Li alloy electrode 4 as a cathode, whereby a current flowed at a density of 8.5 mA/cm$^2$ and orange luminescence was observed at a luminance of 800 cd/m$^2$. The device was further subjected to 100 hours of continuous voltage application at a constant current density of 7.0 mA/cm$^2$ in a nitrogen atmosphere, whereby the device initially exhibited a luminance of 620 cd/m$^2$, which was lowered to 590 cd/m$^2$ after 100 hours, thus showing only a small luminance deterioration.

The results are shown in Table 21 set forth hereinafter.

EXAMPLES B-19 to B-28

Organic luminescence devices were prepared and evaluated in the same manner as in Example B-18 except for replacing the spiro compound (Ex. Comp. No. b-2) with those shown in Table 21, respectively.

The results are inclusively shown in Table 21 set forth hereinafter.

COMPARATIVE EXAMPLES B-3 and B-4

Comparative organic compound devices were prepared and evaluated in the same manner as in Example B-18 except for using Comparative Compound Nos. 1 and 2, respectively, shown above, instead of the spiro compound (Ex. Comp. No. b-2). The results are also shown in Table 21.

TABLE 21

| Example | | Initial | | Luminance (at 7.0 mA/cm$^2$) | |
|---|---|---|---|---|---|
| Example | Compound No. | Voltage (V) | Luminance (cd/m$^2$) | Initial (cd/m$^2$) | After 100 hrs. (cd/m$^2$) |
| B-18 | b-2 | 8 | 800 | 620 | 590 |
| 19 | b-5 | 8 | 530 | 470 | 430 |
| 20 | b-8 | 8 | 780 | 600 | 560 |
| 21 | b-11 | 8 | 490 | 455 | 405 |
| 22 | b-15 | 8 | 790 | 630 | 595 |
| 23 | b-20 | 8 | 980 | 800 | 750 |
| 24 | b-25 | 8 | 830 | 630 | 600 |
| 25 | b-30 | 8 | 800 | 600 | 540 |
| 26 | b-34 | 8 | 780 | 600 | 565 |
| 27 | b-37 | 8 | 770 | 600 | 560 |
| 28 | b-39 | 8 | 810 | 610 | 555 |
| Comp. B-3 | Comp. No. 1 | 8 | 240 | 200 | 110 |
| Comp. B-4 | Comp. No. 2 | 8 | 300 | 240 | 95 |

EXAMPLE B-29

The procedure of Example B-1 was repeated up to the formation of the hole-transporting layer 5.

Then, the hole-transporting layer 5 was further coated by vacuum deposition of aluminum tris(quinolinol) to form a 30 nm-thick luminescence layer 3 and then by vacuum deposition of a spiro compound (Ex. Compound No. b-4) to form a 50 nm-thick electron-transporting layer 6, respectively under a vacuum of 1.0×10$^{-4}$ Pa and at a film thickness growth rate of 0.2–0.3 nm/sec.

Then, the electron-transporting layer 6 was further coated by vacuum deposition of Al—Li alloy (Li content: 1 atom. %) to form a 150 nm-thick metal film 4 under a vacuum of 1.0×10$^{-4}$ Pa and at a film thickness growth rate of 1.0–1.2 nm/sec, thereby forming an organic luminescence device of a structure shown in FIG. 3.

The thus-obtained device was then supplied with a DC voltage of 10 volts between the ITO electrode 2 as an anode and the Al—Li alloy electrode 4 as a cathode, whereby a current flowed at a density of 11.0 mA/cm$^2$ and yellow luminescence was observed at a luminance of 1050 cd/m$^2$. The device was further subjected to 100 hours of continuous voltage application at a constant current density of 10.0 mA/cm$^2$ in a nitrogen atmosphere, whereby the device initially exhibited a luminance of 980 cd/m$^2$, which was lowered to 930 cd/m$^2$ after 100 hours, thus showing only a small luminance deterioration.

The results are shown in Table 22 set forth hereinafter.

EXAMPLES B-30 to B-39

Organic luminescence devices were prepared and evaluated in the same manner as in Example B-29 except for replacing the spiro compound of (Ex. Comp. No. b-4) with those show in Table 22, respectively.

The results are inclusively shown in Table 22 set forth hereinafter.

COMPARATIVE EXAMPLES B-5 to B-6

Comparative organic luminescence devices were prepared and evaluated in the same manner as in Example B-29 except for using Comparative Compound Nos. 1 and 2, respectively, shown above, instead of the spiro compound Ex. Comp. No. b-4. The results are also shown in Table 22.

TABLE 22

| Example | Compound No. | Initial Voltage (V) | Initial Luminance (cd/m$^2$) | Luminance (at 10.0 mA/cm$^2$) Initial (cd/m$^2$) | Luminance (at 10.0 mA/cm$^2$) After 100 hrs. (cd/m$^2$) |
|---|---|---|---|---|---|
| B-29 | b-4 | 10 | 1050 | 990 | 930 |
| 30 | b-6 | 10 | 830 | 700 | 640 |
| 31 | b-13 | 10 | 870 | 730 | 660 |
| 32 | b-16 | 10 | 1010 | 930 | 860 |
| 33 | b-18 | 10 | 850 | 710 | 630 |
| 34 | b-19 | 10 | 820 | 690 | 640 |
| 35 | b-22 | 10 | 1120 | 1040 | 950 |
| 36 | b-28 | 10 | 790 | 700 | 630 |
| 37 | b-32 | 10 | 1000 | 960 | 920 |
| 38 | b-34 | 10 | 1050 | 960 | 910 |
| 39 | b-36 | 10 | 800 | 710 | 640 |
| Comp. B-5 | Comp. No. 1 | 10 | 120 | 100 | 30 |
| Comp. B-6 | Comp. No. 2 | 10 | 160 | 130 | 45 |

EXAMPLE B-40

A transparent conductive substrate prepared and treated for cleaning in the same manner as in Example B-1 was coated with a solution of 0.050 g of a spiro compound (Ex. Comp. No. b-1) and 1.00 g of poly-N-vinylcarbazole (weight-average molecular weight=63,000) in 80 ml of chloroform by spin coating at a rate of 2000 rpm, followed by drying, to form a 120 nm-thick luminescence layer 3.

Then, the luminescence layer 3 was further coated by vacuum deposition of Al—Li alloy (Li content: 1 atom %) to form a 150 nm-thick metal film 4 under a vacuum of $1.0 \times 10^{-4}$ Pa and at a film thickness growth rate of 1.0–1.2 nm/sec, thereby forming an organic luminescence device of a structure shown in FIG. 1.

The thus-obtained device was then supplied with a DC voltage of 10 volts between the ITO electrode 2 as an anode and the Al—Li alloy electrode 4 as a cathode, whereby a current flowed at a density of 9.0 mA/cm$^2$ and orange luminescence was observed at a luminance of 410 cd/m$^2$.

COMPARATIVE EXAMPLE B-7

An organic luminescence device was prepared in the same manner as in Example B-40 except for using Comparative Compound No. 2 instead of the spiro compound Ex. Comp. No. b-1.

The resultant device was similarly supplied with a DC voltage of 10 volts, whereby a current followed at a density of 9.0 mA/cm$^2$ and yellow-green luminescence was observed at a luminance of 30 cd/m$^2$.

INDUSTRIAL APPLICABILITY

As described above, the organic luminescence device according to the present invention using a spiro compound represented by the above-mentioned formula (I-a) or (I-b) produces high-luminance luminescence at a low applied voltage and is excellent in durability. Particularly, an organic layer using the spiro compound of formula (I-a) or (I-b) is suitable for an electron-transporting layer or a luminescence layer constituting an organic luminescence device. Further, it is possible to produce the organic luminescence device through vacuum deposition, casting, wet-coating (e.g., spin coating), etc., thus readily realizing a large-size organic luminescence device relatively inexpensively.

What is claimed is:

1. An organic luminescence device, comprising:

a pair of an anode and a cathode, and at least one organic layer disposed between the anode and the cathode, wherein said at least one organic layer comprises a layer comprising at least one species of a compound represented by any one of the following formulas (III-b) to (IX-b):

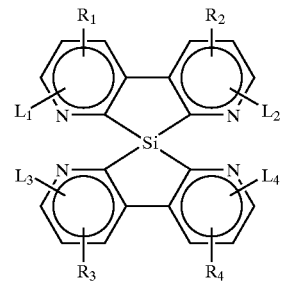

(III-b)

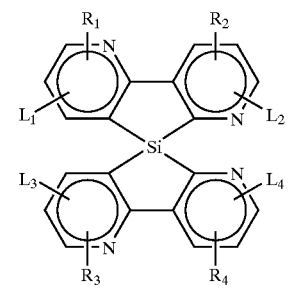

(IV-b)

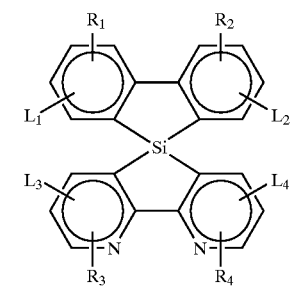

(V-b)

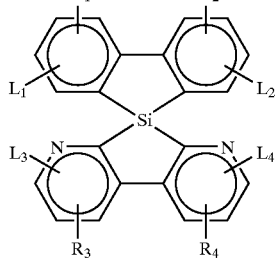

(VI-b)

(VII-b)

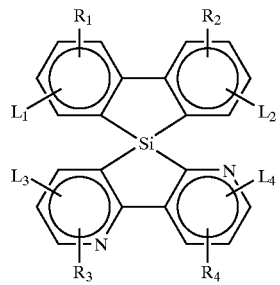

(VIII-b)

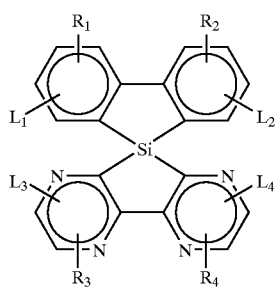

(IX-b)

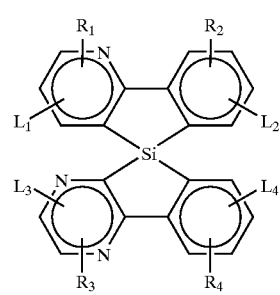

wherein $R_1$ to $R_4$ independently denote a hydrogen atom, an alkyl group, a substituted or unsubstituted aralkyl group, a substituted or unsubstituted aryl group, a substituted or unsubstituted heterocyclic group, an alkoxy group, a nitro group, or a substituted or unsubstituted amino group; and $L_1$, $L_2$, $L_3$ and $L_4$ independently denote a hydrogen atom, an alkyl group, a substituted or unsubstituted aralkyl group, a substituted or unsubstituted aryl group, a substituted or unsubstituted heterocyclic group, an alkoxy group, a nitro group, a substituted or unsubstituted amino group, or a group represented by any one of the following formulas (X), (XI) and (XII):

(X)

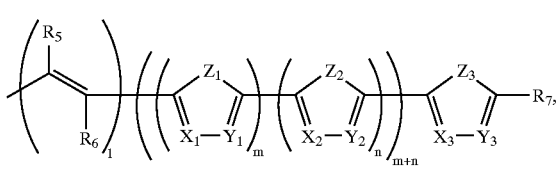

(XI)

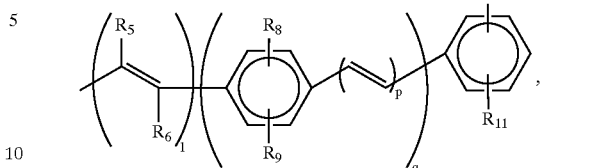

(XII)

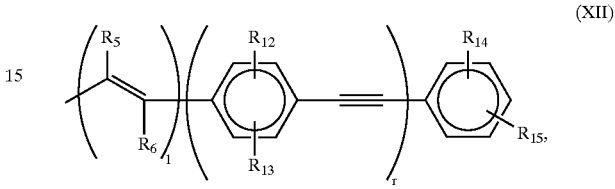

wherein $R_5$ to $R_{15}$ independently denote a hydrogen atom, an alkyl group, a substituted or unsubstituted aralkyl group, a substituted or unsubstituted aryl group, a substituted or unsubstituted heterocyclic group, or a nitro group;

$X_1$ to $X_3$ and $Y_1$ to $Y_3$ independently denote a nitrogen atom or C—$R_{16}$ where $R_{16}$ denotes a hydrogen atom, an alkyl group, a substituted or unsubstituted aralkyl group, or a substituted or unsubstituted aryl group;

$Z_1$ to $Z_3$ independently denote —O—, —S—, —$NR_{17}$—, —Si($R_{18}$)$R_{19}$—, —C($R_{20}$)$R_{21}$—, —CH=CH— or —CH=N— in which $R_{17}$, $R_{20}$ and $R_{21}$ independently denote a hydrogen atom, an alkyl group, a substituted or unsubstituted aralkyl group, a substituted or unsubstituted aryl group, or a substituted or unsubstituted heterocyclic group; and $R_{18}$ and $R_{19}$ independently denote an alkyl group, a substituted or unsubstituted aralkyl group, a substituted or unsubstituted aryl group, or a substituted or unsubstituted heterocyclic group;

l and p are independently 0 or 1;

m and n are independently 0 or an integer of 1–30, with the proviso that m+n is an integer of 1–30; and q and r are independently an integer of 2–30.

2. An organic luminescence device according to claim 1, wherein at least one of $L_1$ to $L_4$ is said group represented by any one of the formulas (X), (XI) and (XII).

3. An organic luminescence device according to claim 1, wherein said layer comprising at least one species of the compound comprises an electron injection layer, an electron-transporting layer or a luminescence layer.

* * * * *